US006784814B1

(12) United States Patent
Nair et al.

(10) Patent No.: US 6,784,814 B1
(45) Date of Patent: Aug. 31, 2004

(54) CORRECTION FOR PIPELINED ANALOG TO DIGITAL (A/D) CONVERTER

(75) Inventors: Kavita Nair, Eden Prairie, MN (US); Ramesh Harjani, Minneapolis, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 0 days.

(21) Appl. No.: 10/384,162

(22) Filed: Mar. 7, 2003

(51) Int. Cl.[7] .............................................. H03M 1/06
(52) U.S. Cl. ...................................... 341/118; 341/120
(58) Field of Search ................................ 341/118, 120, 341/143, 155

(56) References Cited

U.S. PATENT DOCUMENTS

| | | | |
|---|---|---|---|
| 5,635,937 A | | 6/1997 | Lim et al. |
| 5,696,511 A | | 12/1997 | Matsumoto et al. |
| 5,821,893 A | | 10/1998 | Kumamoto et al. |
| 6,211,806 B1 | | 4/2001 | McCarroll |
| 6,359,579 B1 | | 3/2002 | Chiang |
| 6,404,364 B1 | | 6/2002 | Fetterman et al. |
| 6,456,223 B1 | * | 9/2002 | Yu et al. ...................... 341/161 |
| 6,486,807 B2 | * | 11/2002 | Jonsson ....................... 341/120 |
| 6,501,400 B2 | * | 12/2002 | Ali ............................... 341/118 |
| 6,577,185 B1 | * | 6/2003 | Chandler et al. ............... 330/9 |
| 6,580,383 B1 | * | 6/2003 | Devendorf et al. ......... 341/143 |
| 2002/0039076 A1 | | 4/2002 | Soenen |
| 2002/0041247 A1 | | 4/2002 | Steensgaard-Madsen |
| 2002/0041248 A1 | | 4/2002 | Galton |

OTHER PUBLICATIONS

Ali et al., "Correction of operational amplifier gain error in pipelined A/D converters," *The Institute of Electrical and Electronics Engineers, Inc.*, 2001; I–568–I–571.

Betts et al., "Amplifier gain insensitive SC integrators with 'same–sample correction' of both gain and phase errors for singlepath and multipath circuits," *Electronics Letters*, Aug. 1, 1991; 27(16):1424–1426.

Carbone et al., "Conversion Error in D/A Converters Employing Dynamic Element Matching," *1994 IEEE International Symposium on Circuits and Systems*, London, England, May 30–Jun. 2, 1994; 2:13–16.

Carley et al., "A 16–bit 4th order noise–shaping D/A converter," *Proc. IEEE 1988 Custom Integrated Circuits Conference*, Rochester, NY, May 16–19, 1988; pp. 21.7.1–21.7.4.

Carley, "A Noise–Shaping Coder Topology for 15+ Bit Converters," *IEEE J. Solid–State Circuits*, 1989, 24(2):267–273.

(List continued on next page.)

*Primary Examiner*—Michael Tokar
*Assistant Examiner*—Linh V Nguyen
(74) *Attorney, Agent, or Firm*—Mueting, Raasch & Gebhardt, P.A.

(57) ABSTRACT

An analog to digital method and apparatus corrects non-linearity error and gain error in a multiple stage pipeline analog to digital converter over a plurality of clock cycles. Preferably, continuous correction, during each of the plurality of clock cycles, of at least portion of non-linearity error introduced by a digital to analog conversion is performed in a first stage of the multiple stage pipeline analog to digital converter with use of an averaging over time of a first stage digital residue signal provided by the remainder stages of the multiple stage pipeline analog to digital converter. Such correction is used to provide a non-linearity corrected digital signal. Correction, during each of the plurality of clock cycles, of at least a portion of a gain error introduced by one or more amplifiers in the multiple stage pipeline analog to digital converter is provided by averaging the non-linearity corrected digital signal over time.

33 Claims, 12 Drawing Sheets

OTHER PUBLICATIONS

Cho et al., "A 10 b, 20 Msample/s, 35 mW Pipeline A/D Converter," *IEEE J. Solid–State Circuits*, 1995; 30(3):166–172.

Fogleman et al., "A Dynamic Element Matching Technique for Reduced–Distortion Multibit Quantization in Delta–Sigma ADCs," *IEEE Transactions on Circuits and Systems–II: Analog and Digital Signal Processing*, 2001; 48(2):158–170.

Galton et al., "A Rigorous Error Analysis of D/A Conversion with Dynamic Element Matching," *IEEE Transactions on Circuits and Systems–II: Analog and Digital Signal Processing*, 1995; 42(12):763–772.

Galton, "Digital Cancellation of D/A Converter Noise in Pipelined A/D Converters," *IEEE Transactions on Circuits and Systems–II: Analog and Digital Signal Processing*, 2000; 47(3):185–196.

Gray et al., "Dithered Quantizers," *IEEE Trans. Inform. Theory*, 1993; 39(3):805–812.

Jensen et al., "An Analysis of the Partial Randomization Dynamic Element Matching Technique," *IEEE Transactions on Circuits and Systems–II: Analog and Digital Signal Processing*, 1998, 45(12):1538–1549.

Jensen et al., "A performance analysis of the partial randomization dynamic element matching DAC architecture," *Proc. 1997 IEEE International Symposium on Circuits and Systems*, Hong Kong, Jun. 9–12, 1997; 9–12.

Kwan et al., "A Stereo Multibit ΣΔ DAC with Asynchronous Master–Clock Interface," *IEEE J. Solid–State Circuits*, 1996; 31(12):1881–1887.

Lee et al., "Gain Error Correction Scheme for Multiply–By–Two Gain Amplifier in Pipelined ADC," *The Institute of Electrical and Electronics Engineers, Inc.*, 1999; 190–193.

Lee et al., "Interstage Gain Proration Technique for Digital–Domain Multi–Step ADC Calibration," *IEEE Transactions on Circuits and Systems–II: Analog and Digital Signal Processing*, Jan. 1, 1994; 41(1):12–18.

Lewis et al., "A Pipelined 5–Msample/s 9–bit Analog–To–Digital Converter," *IEEE J. Solid–State Circuits*, 1987; SC–22(6):954961.

Lewis et al., "A 10–b 20–Msample/s Analog–to–Digital Converter," *IEEE J. Solid–State Circuits*, 1992; 27(3):351–358.

Li et al., "High–speed pipelined A/D converter using time–shifted CDS technique," *2002 IEEE International Symposium on Circuits and Systems*, Phoenix–Scottsdale, AZ, May 26–29, 2002; I–909–I–912.

Lin, "Performance limitations on high–resolution video–rate analog–digital interfaces," *Electronics Research Laboratory, University of California, Berkely, CA, Memorandum No. UCB/ERL M90/55*, Jun. 19, 1990; title page, pg. i–v, and 127 pgs.

Lin et al., "A 13–b 2.5–MHz Self–Calibrated Pipelined A/D Converter in 3–μm CMOS," *IEEE J. Solid–State Circuits*, 1991; 26(4):628–636.

Lin et al, "A Bandpass Mismatch–Shaped Multi–Bit ΣΔ Switched–Capacitor DAC Using Butterfly Shuffler," *1999 IEEE International Solid–State Circuits Conference: Digest of Technical Papers, 1st Edition*, Feb. 1999; 2 pgs.

Mayes et al., "A 200 mW, 1 Msample/s, 16–b Pipelined A/D Converter with On–Chip 32–b Microcontroller," *IEEE J. Solid–State Circuits*, 1996; 31(12):1862–1872.

Nagaraj et al., "A 250–mW, 8–b, 52–Msample/s Parallel–Pipelined A/D Converter with Reduced Number of Amplifiers," *IEEE J. Solid–State Circuits*, 1997; 32(3): 312–320.

Pelka et al., "Nonlinearity Correction of the Integrated Time–to–Digital Converter with Direct Coding," *1996 Conference On Precision Electromagnetic Measurements Digest*, Braunschweig, Germany, Jun. 17–20, 1996; 548–549.

Sculley et al., "A High Resolution Nonlinearity Correcting A/D Converter Architecure," *IEEE Symposium on Circuits and Systems*, 1993; 1212–1215.

Sculley et al., "Nonlinearity Correction Techniques for High Speed, High Resolution A/D Conversion,," *IEEE Transactions on Circuits and Systems–II: Analog and Digital Signal Processing*, 1995; 42(3):154–163.

Siragusa et al., "Gain erric correction technique for pipelined analogue–to–digital converters," *Electronic Letters*, Mar. 30, 2000; 36(7):617–618.

Sripad et al., "A Necessary and Sufficient Condition for Quantization Errors to be Uniform and White," *IEEE Trans. Acoust. Speech Signal Processing*, 1977; ASSP–25(5):442–448.

* cited by examiner

CORRECTION FOR PIPELINED ANALOG TO DIGITAL (A/D) CONVERTER

BACKGROUND OF THE INVENTION

The present invention relates generally to analog-to-digital (A/D) converters and conversion techniques. More particularly, the present invention pertains to correction of nonlinearity and gain error in A/D converters and conversion techniques, e.g., pipelined A/D converters.

FIG. 1 illustrates a conventional pipelined A/D converter 10. The A/D converter 10 converts an analog electrical input signal Vin into a digital representation thereof Dout, e.g., analog samples of the input Vin are converted. Various illustrative exemplary n-bit A/D converters can be implemented. It should be understood that a resolution of any number of bits may be implemented uses a varied number of different stages 12 of the A/D converter 10. In other words, the resolution of an A/D converter can be referred to as an n-bit A/D converter, where n represents the number of digital output bits. The A/D converter 10 has the analog input signal Vin provided on an initial stage 16 of the plurality of stages 12. Each of the plurality of stages 12 of the A/D converter 10 converts a portion of the analog input Vin applied to input 14, and as such contributes to the digital output representation Dout.

The pipelined A/D converter 10 receives the analog input Vin at the first stage 16 for processing. The first stage determines one or more bits. A residue R0 representing the portion of the analog input Vin not converted by the initial stage 16 is generated and passed to a subsequent stage for processing to determine one or more digital bits. This process continues through each of the remaining stages 19 of the plurality of stages 12 which form part of the A/D converter 10. In other words, when a prior stage completes processing of an analog input or a residue applied thereto, it provides for an analog residue to be applied to a next subsequent stage for analog to digital conversion and for application of an analog residue to the next subsequent stage. The prior stage is then ready to receive a new analog input sample or residue to process. In other words, a pipeline is filled.

Due to the time required to fill the pipeline, pipelining causes an initial latency in computing the digital representation corresponding to an analog input sample. However, pipelining increases the rate at which digital representations corresponding to sequential analog input samples are generated by the converter due to the parallel processing of the sampled analog input signal.

As shown in FIG. 1, the pipelined A/D converter 10 includes M pipelined stages 12 and a digital error correction (DEC) circuit (e.g., a combining circuit) 18. The pipelined initial stage 16 receives the analog input signal Vin at input 14. The pipelined stages 12 produce respective analog outputs, e.g., analog outputs 20, 22, or, in other words, analog residues such as R0 from the first stage 16. The analog residues (e.g., R0) from respective pipelined stages 12 are respectively coupled to the analog inputs of subsequent pipelined stages. For example, analog residue R0 resulting from the initial stage 16 is coupled to stage 2 (one of blocks 19 of stages 12).

Generally, each stage includes similar elements. For example, as shown in FIG. 1, stage 2 (one of blocks 19 of the stages 12) includes a sample and hold circuit 30, an analog-to-digital converter (ADC) 32, a digital-to-analog converter (DAC) 34, and a summing circuit 36. The sample and hold circuit 30 receives the analog input signal 31 applied thereto (i.e., amplified analog residue R0) and holds the signal for later processing to generate the analog input of the next stage of the pipelined A/D converter 10 (i.e., stage 3).

The ADC 32 performs an analog-to-digital conversion of the input signal resulting in N bits 35 to be provided to DEC circuit 18. The N-bit digital output 35 of stage 2 is provided to DAC 34 for conversion to an analog signal 37 based thereon. The analog signal 37 is subtracted in summing circuit 36 from the held analog sample signal 39 to generate the analog residue 22 of stage 2. In other words, the difference between the analog input to ADC 32 and the DAC 34 analog output provides the residue 22. The residue 22 is amplified by an interstage amplifier 40 to provide an amplified residue 22 to be applied to stage 3. In the exemplary embodiment of stage 2, the amplification has a gain of $2^N$.

The digital outputs of each stage 12 (e.g., digital output 35 of stage 2) are input to DEC circuit 18. The DEC circuit 18 generates the digital output Dout of the A/D converter 10, i.e., a series of bits, based on the digital outputs from all the stages 12. For example, if the digital output includes $D_{M-1}$ to $D_0$, and n=4 bits, then the digital output is $D_3, D_2, D_1,$ and $D_0$, where $D_3$ is the most significant bit (MSB) and $D_0$ is the least significant bit (LSB). The DEC circuit 18 has, for example, a series of delays, or shift registers, to delay the digital output of each stage 12 so that the respective digital outputs for the same sampled signal can be combined.

Pipelined A/D converters are generally known and may be implemented in any number of ways. For further information regarding such conventional A/D converters, the following reference materials are provided: Stephen H. Lewis et al., "A Pipelined 5-Msample/s 9-bit Analog-to-Digital Converter," IEEE J. Solid-State Circuits, vol. Sc-22, no. 6, pages 954–961, Dec. 1987; Stephen H. Lewis et al., "A 10-b 20-Msample/s Analog-to-Digital Converter," IEEE J. Solid-State Circuits, vol. 27, no. 3, pages 351–358, March 1992; Thomas B. Cho et al., "A 10 b, 20 Msample/s, 35 mW Pipeline A/D Converter," IEEE J. Solid-State Circuits, vol. 30, no. 3, pages 166–172, March 1995; Krishnaswamy Nagaraj et al., "A 250-mW, 8-b, 52-Msample/s Parallel-Pipelined A/D Converter with Reduced Number of Amplifiers," IEEE J. Solid-State Circuits, vol. 32, no. 3, pages 312–320, March 1997; and Yuh-Min Lin et al., "A 13-b 2.5-MHz Self-Calibrated Pipelined A/D Converter in 3-$\mu$m CMOS," IEEE J. Solid-State Circuits, vol. 26, no. 4, pages 628–636, April 1991, each of which are incorporated by reference in their entireties.

As is apparent, the pipelined A/D converter 10 includes analog portions and digital portions. For example, the DEC circuit 18 is a digital component portion, whereas the DAC 34, and interstage amplifier 40, are analog portions. In practice, every analog component in the pipelined A/D converter 10 exhibit non-ideal circuit behavior that will tend to degrade the overall conversion performance of the converter 10. For example, in typical switched capacitor implementations of DACs, noise or nonlinearity arises from the static capacitor mismatches employed in the digital-to-analog conversion performed thereby.

There is a speed/accuracy design tradeoff in the design of high-end pipelined A/D converters. Generally, the desired accuracy of a pipelined architecture is limited by nonlinearity, offset, and gain errors. For example, such errors may be introduced by the input sample and hold, the ADC of each stage, the DAC of each stage, and the interstage gain amplification of the analog residues provided by a stage to a subsequent stage. As indicated above, such various non-idealities in the A/D converter 10 result in errors, e.g., nonlinearity error, being present in the A/D converter transfer function and result in a corresponding reduction in performance of the A/D converter.

To meet the accuracy requirements as defined by the bits of A/D resolution, the nonlinearities must not exceed 1 least significant bit (LSB) in magnitude. Although the nonlinearities in a pipelined A/D converter may be less than 1 LSB, they may have a repetitive or periodic nature, which results in the generation of spurious tones in the frequency spectra of the digital representation of the analog input. An important measure of an A/D converter's performance is spurious free dynamic range (SFDR), which is defined in the frequency domain as the amplitude difference between a spectrally pure input signal and the highest non-input signal component present in the frequency spectra of the A/D converter's digital output representation Dout of the analog input signal Vin. Some of the non-idealities that affect the SFDR performance of the pipeline converters include, but clearly is not limited to, the amplification techniques, capacitor matching, and reference voltage variations.

SFDR is particularly important in a communication system. For example, A/D converter design for wideband receivers in a communication system are of significant importance. Such wideband receivers must be able to enable greater traffic density and flexibility and also handle multiple modulation standards. As a result of such requirements, most signal processing in the receiver design is performed in the digital domain and, as such, the A/D converter is used at the head end of the signal chain in such a receiver design. Therefore, A/D converter performance requirements, particularly for such communication system receiver designs, are significantly greater than for most other A/D converter designs. For example, at least with respect to a particular embodiment of receivers, A/D converters must be able to perform at high speed in the range of 50 to 65 MHz, and also have a resolution of at least 16 bits with an effective number of bits being in the range of 12.83 to 14.75 bits. Further, the SFDR should be in the range of 96 db to 115 db. Likewise, the design should always be kept to a minimum chip implementation area with cost considerations taken into consideration.

Pipelined A/D converters such as those described herein may be used for to such communication system applications. However, to meet the ever increased A/D converter requirements, the non-idealities present in pipelined A/D converters need to be addressed.

Various techniques attempt to address certain non-idealities of a pipelined A/D converter. For example, in U.S. Patent Application Publication 2002/0041248 A1 to Galton, entitled "Digital Cancellation of D/A Converter Noise in Pipelined A/D Converters," published 11 Apr. 2002, a digital noise cancellation logic circuit that measures and cancels the A/D conversion error caused by DAC noise is presented for a switched capacitor based pipelined A/D converter. Galton alleges to provide a technique for digital cancellation of DAC noise arising from static analog errors such as capacitor mismatches. Further, for example, in an article by E. J. Siragusa and I. Galton, entitled "Gain error correction technique for pipelined analogue-to-digital converters," Electronic Letters, vol. 36, no. 7, Mar. 2000, a gain error correction technique is presented that measures and digitally compensates for analog gain errors present in each stage of a pipelined A/D converter.

Although various techniques have been provided to attempt to separately address nonlinearity and gain error for pipelined A/D converters, there is further need for techniques to improve analog to digital conversion performance, e.g., SFDR.

SUMMARY OF THE INVENTION

The present invention provides correction for non-linearity and gain error in A/D converters and conversion techniques.

A method of correcting error in a multiple stage analog to digital converter over a plurality of clock cycles (e.g., a plurality of clock cycles preceded by a plurality of initial startup cycles) according to the present invention includes providing a digital signal from a first stage of the multiple stage analog to digital converter based on an input signal to the first stage of the multiple stage analog to digital converter. An analog signal is provided from the first stage of the multiple stage analog to digital converter based on the first stage digital signal. The analog signal provided by the first stage of the multiple stage analog to digital converter is subtracted from the input signal resulting in a first stage analog residue signal. The resultant first stage analog residue signal is amplified and the amplified first stage analog residue signal is applied to a second stage of one or more subsequent stages of the multiple stage analog to digital converter. A first stage digital residue signal is provided from the one or more subsequent stages based on the amplified first stage analog residue signal applied thereto. Continuously, over the plurality of clock cycles, averaging the first stage digital residue signal with a pseudorandom sequence results in an averaged first stage digital residue correction signal. The averaged first stage digital residue correction signal is subtracted from a sum of the first stage digital residue signal and the first stage digital signal of the multiple stage analog to digital converter for use in providing a non-linearity corrected digital output signal. Also, continuously, over the plurality of clock cycles, the non-linearity corrected digital output signal is averaged to correct for gain error.

In one embodiment of the method, subtracting the averaged first stage digital residue correction signal from a sum of the first stage digital residue signal and the first stage digital signal of the multiple stage analog to digital converter to provide a non-linearity corrected digital output signal includes subtracting the averaged first stage digital residue correction signal from the first stage digital residue signal resulting in a corrected first stage digital residue signal. The corrected first stage digital residue signal is summed with the first stage digital signal resulting in the non-linearity corrected output signal.

In another embodiment of the method, the method further includes providing and subtracting additional averaged digital residue correction signals associated with additional stages of the one or more subsequent stages to correct for non-linearity.

In another embodiment of the method, the method includes correcting alignment of the first stage digital residue signal and the digital signal from the first stage of the multiple stage analog to digital converter (e.g., using DEC logic).

Yet further, in another embodiment, averaging the first stage digital residue signal with a pseudorandom sequence resulting in an averaged first stage digital residue correction signal includes averaging the first stage digital residue signal with a pseudorandom sequence that is based on a pseudorandom sequence used to provide the analog signal from the first stage of the multiple stage analog to digital converter based on the digital signal.

Preferably, according to the present invention, providing the digital signal from the first stage of the multiple stage analog to digital converter based on the input signal to the first stage includes providing an N-bit digital signal from the first stage of the multiple stage analog to digital converter based on the input signal thereto; N is an integer in the range of 3 to 6.

Another method of correcting non-linearity error and gain error in a multiple stage pipeline analog to digital converter according to the present invention is described. The method includes using an analog to digital conversion to provide a digital signal from a first stage of the multiple stage pipeline analog to digital converter based on an input signal to the first stage thereof and using a digital to analog conversion to provide an analog signal from the first stage of the multiple stage pipeline analog to digital converter based on the first stage digital signal provided by the analog to digital conversion. The digital to analog conversion introduces non-linearity error into the multiple stage pipeline analog to digital converter. The analog signal provided by the digital to analog conversion is subtracted from the input signal resulting in a first stage analog residue signal. The resultant first stage analog residue signal is amplified and the amplified first stage analog residue signal is applied to one or more subsequent stages of the multiple stage pipeline analog to digital converter. The amplification introduces gain error into the multiple stage pipeline analog to digital converter. At least an analog to digital conversion is used to provide a first stage digital residue signal from the one or more subsequent stages based on the amplified first stage analog residue signal. A digital output is provided during each clock cycle of a clock time period based on at least the first stage digital signal provided by the analog to digital conversion in the first stage and the first stage digital residue signal. Providing the digital output includes correcting, during each clock cycle of a plurality of clock cycles of the clock time period, at least a portion of the non-linearity error with use of an averaging over time of the first stage digital residue signal with a pseudorandom sequence, wherein such correction is used to provide a non-linearity corrected digital signal. Further, providing the digital output includes correcting, during the each clock cycle of a plurality of clock cycles of the clock time period, at least a portion of the gain error by averaging the non-linearity corrected digital signal over time.

In one embodiment of the method, correcting at least a portion of the non-linearity error includes averaging the first stage digital residue signal with a pseudorandom sequence resulting in an averaged first stage digital residue correction signal, subtracting the averaged first stage digital residue correction signal from the first stage digital residue signal resulting in a corrected first stage digital residue signal, and summing the corrected first stage digital residue signal with the first stage digital signal for use in providing the non-linearity corrected digital signal.

In another embodiment, averaging over time of the first stage digital residue signal with a pseudorandom sequence includes averaging the first stage digital residue signal with a pseudorandom sequence that is based on a pseudorandom sequence used to perform the digital to analog conversion.

Further, another method of correcting non-linearity error and gain error in a multiple stage pipeline analog to digital converter over a plurality of clock cycles is described. The method includes correcting, during each of the plurality of clock cycles, at least a portion of non-linearity error introduced by a digital to analog conversion performed in a first stage of the multiple stage pipeline analog to digital converter with use of an averaging over time of a first stage digital residue signal provided by the remainder stages of the multiple stage pipeline analog to digital converter. Such correction is used to provide a non-linearity corrected digital signal. The method further includes correcting, during each of the plurality of clock cycles, at least a portion of a gain error introduced by one or more amplifiers in the multiple stage pipeline analog to digital converter by averaging the non-linearity corrected digital signal over time.

In one embodiment, averaging over time of the first stage digital residue signal includes averaging the first stage digital residue signal with a pseudorandom sequence that is based on a pseudorandom sequence used to perform the digital to analog conversion.

A multiple stage pipeline analog to digital converter apparatus is also provided. The apparatus includes a plurality of stages including a first stage and one or more subsequent stages. At least the first stage is configured to receive an input signal and is connected to a subsequent stage by an amplifier. The first stage includes an analog to digital converter (e.g., an N-bit analog to digital converter, where N is an integer in the range of 3 to 6) configured to receive the input signal and convert the input signal into a digital signal, a digital to analog converter configured to receive the digital signal from the analog to digital converter and convert the digital signal to an analog signal, and a subtraction circuit operable to subtract the analog signal received from the digital to analog converter from the input signal applied to the first stage resulting in a first stage analog residue signal that is applied to the amplifier between the first stage and the one or more subsequent stages. The one or more subsequent stages include at least one stage operable to convert the first stage analog residue signal to a first stage digital residue signal. The apparatus further includes a non-linearity correction circuit associated with the first stage operable to continuously provide, during each of a plurality of clock cycles, an average of the first stage digital residue signal with a pseudorandom sequence resulting in an averaged first stage digital residue correction signal.

Further, the apparatus includes a combining circuit configured to subtract the averaged first stage digital residue correction signal from a sum of the first stage digital signal provided by the analog to digital converter and at least the first stage digital residue signal for use in providing a non-linearity corrected digital output signal. In addition, the apparatus includes a gain correction circuit operable to continuously provide, during each of the plurality of clock cycles, an average of the non-linearity corrected digital output signal.

In one embodiment of the apparatus, the logic circuit is configured to subtract the averaged first stage digital residue correction signal from the first stage digital residue signal resulting in a corrected first stage digital residue signal and, thereafter, sum the corrected first stage digital residue signal with the first stage digital signal for use in providing the non-linearity corrected digital output signal.

In another embodiment of the apparatus, at least one additional stage of the one or more subsequent stages includes an additional non-linearity correction circuit associated with the additional stage operable to average an additional stage digital residue signal with a pseudorandom sequence resulting in an additional stage averaged correction signal. A combining circuit is further configured to subtract the additional stage averaged correction signal from the sum of the first stage digital signal and at least the first stage digital residue signal for use in providing the non-linearity corrected digital output signal.

In yet another embodiment, the combining circuit includes digital correction circuitry configured to align at least the first stage digital residue signal provided by the one or more subsequent stages of the multiple stage pipeline analog to digital converter apparatus.

Yet further, in another embodiment, the digital to analog converter of the first stage has an associated pseudo-random sequence associated therewith. The pseudorandom sequence used by the non-linearity correction circuit is a pseudorandom sequence based on the pseudorandom sequence associated with the digital to analog converter.

The methods and apparatus described herein may be advantageously used as part of a communication system, e.g., a base station of a communication system.

DETAILED DESCRIPTION OF THE EMBODIMENTS

The present invention shall be generally described with reference to FIGS. 1–4. Thereafter, various exemplary embodiments of the present invention shall be described with reference to FIGS. 5–12.

Figure 1:
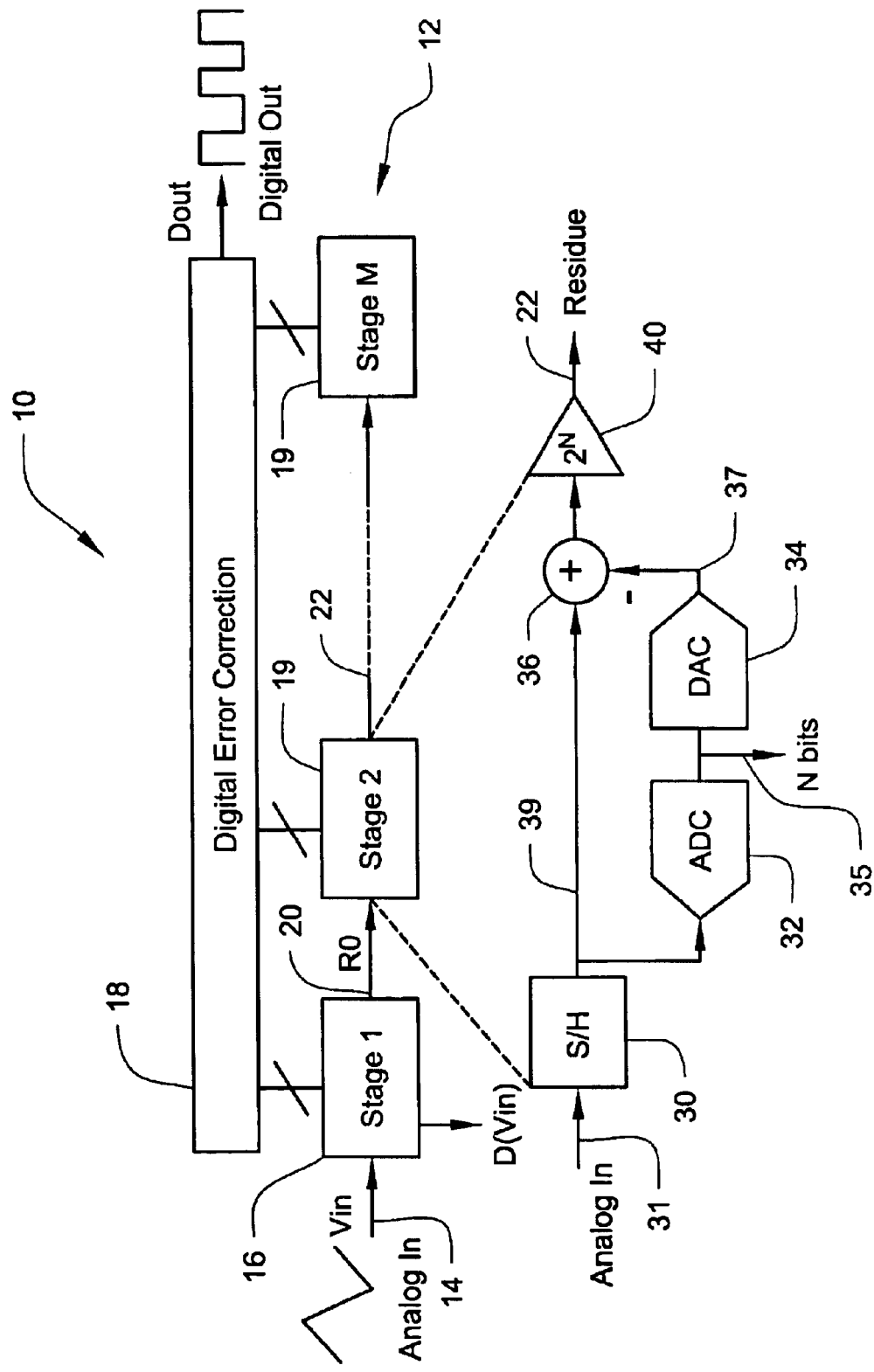
FIG. 1 is a block diagram of a conventional pipelined A/D converter.
Figure 2:
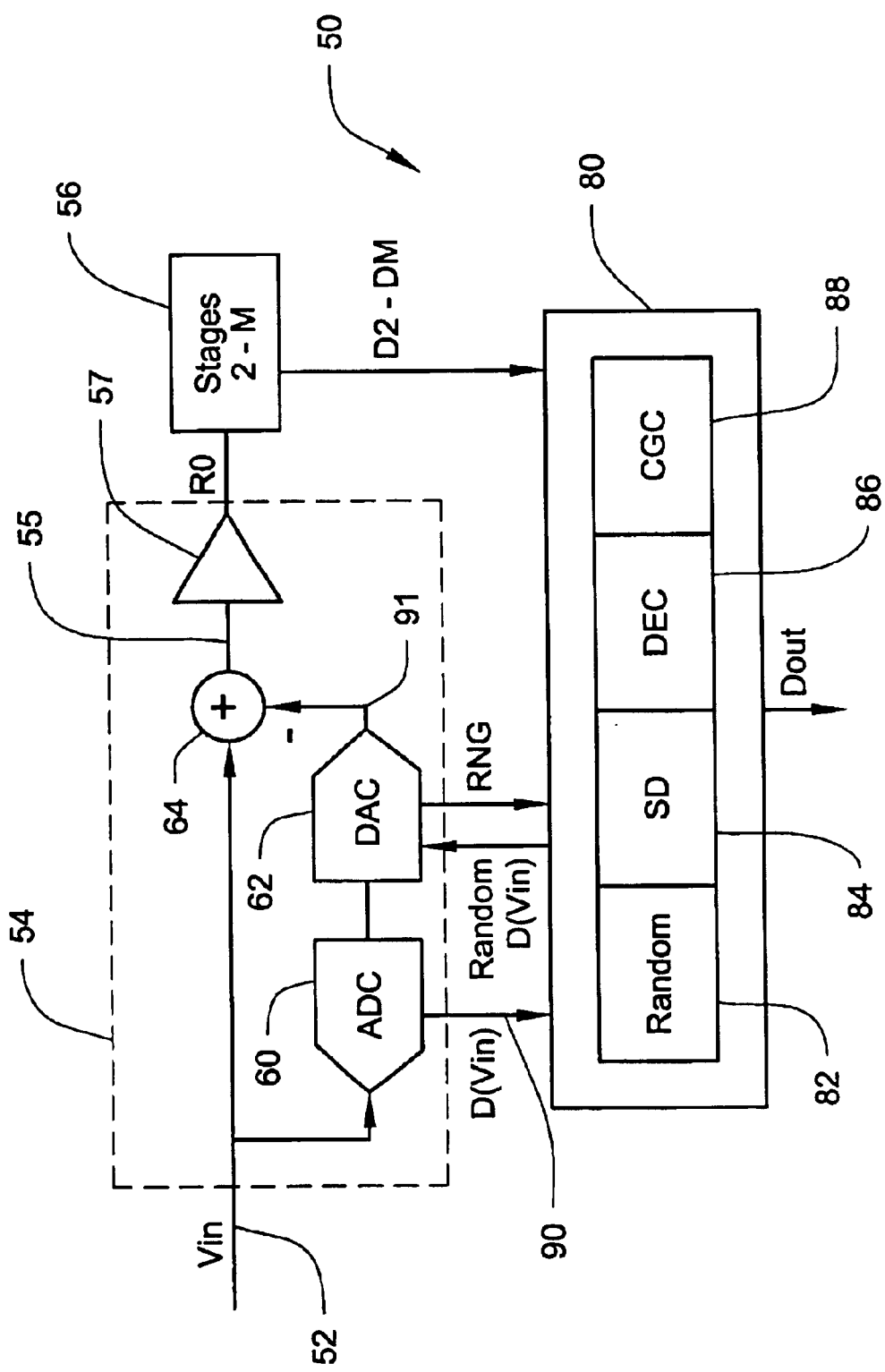
FIG. 2 is a general block diagram of a pipelined A/D converter apparatus according to the present invention.

FIG. 2 is a general block diagram of a pipelined A/D converter apparatus 50 according to the present invention. The A/D converter apparatus 50 includes an initial stage 54 (also referred to herein as the first stage 54) that is coupled to one or more subsequent stages 56 via interstage amplifier 57. The one or more subsequent stages 56 as generally shown in FIG. 2 include stages 2 through M. The A/D converter apparatus 50 further includes one or more circuits 80 for carrying out various functionality as shall be described further herein, e.g., randomization, gain error correction, etc.

The first stage 54 is operable to receive an analog input signal Vin at input 52. For example, although not shown, a sample and hold circuit may be used to sample an input signal Vin and apply the sampled signal to an ADC 60 of the first stage. The ADC 60 of the first pipelined stage 54 produces a multi-bit digital output D(Vin) 90. For example, in one or more embodiments herein, the digital output 90 represents a digital number in a form commonly referred to in the art as a thermometer code. The digital output 90 based on the sampled analog input signal Vin received at input 52 of the first stage 54 of the A/D converter apparatus 50 is provided by the ADC 60 to the one or more circuits 80 for further processing. For example, the digital output 90 may be operated upon by digital error correction (DEC) logic 86, which may also be referred to as a combining circuit. Further, a randomized digital output 90 is also provided to DAC 62.

The DAC 62 provides a digital-to-analog conversion of digital output D(Vin) 90 resulting in an analog signal 91 based thereon. Generally, the sampled analog input signal Vin applied at input 52 is held by sample and hold circuitry (not shown) such that the analog signal 91 based on digital output D(Vin) 90 can be subtracted therefrom by circuit or summing node 64 to provide first stage analog residue R0. In other words, the first stage 54 produces a respective analog output 55 which represents a residue R0.

The first stage analog residue R0 is respectively coupled to the analog input of a next stage of the one or more subsequent stages 56, or, in other words, a second stage. Preferably, the first stage analog residue R0 is coupled to the analog input of the second stage (e.g., stage 2) via the interstage amplifier 57. Generally, the residue R0 is amplified by a gain factor chosen to reduce comparator offset in the later stages. For example, the gain for the interstage amplifier 57 may be $2^{(N-1)}$, where N is equal to the bit resolution of the first stage. For example, for a 4-bit first stage, the gain would be set at 8.

Generally, each of the one or more subsequent stages 56 receives a respective analog input signal at an input thereof and is configured substantially similar to the first stage 54. Each of such one or more subsequent stages 56 provides a respective digital output represented generally as D2-DM. Further, each of the stages provides an analog output based on the digital output thereof for use in providing the analog residue of that stage to the next subsequent stage. The analog output from the final stage M is generally ignored (e.g., the last stage generally does not include a DAC). The digital outputs from the one or more subsequent stages 56 (i.e., when combined being representative of residue R(0)) are provided from the one or more subsequent stages 56 to the one or more circuits 80 for processing, e.g., are provided to the digital error correction logic 86 of the one or more circuits 80.

Generally, for example, the DEC logic 86 of the one or more circuits 80 is used for alignment of the digital output bits from the first stage 54 and/or the subsequent stages 56. In other words, the DEC logic 86 is conventional logic generally used to add a series of delays, or shift registers, to delay the digital outputs from one or more of the stages 54, 56 so that the respective digital outputs based on the same sample can be combined effectively.

Various manners of implementing DEC have been described and the present invention is not limited to any particular implementation. For example, DEC logic is described in U.S. Pat. No. 6,359,579 to Chiang, entitled "Digital Logic Correction Circuit for a Pipeline Analog to Digital (A/D) Converter" issued 19 Mar. 2002; and U.S. Pat. No. 6,211,806 to McCarroll, entitled "Efficient Error Correction in Pipelined Analog-to Digital Converters" issued 3 Apr. 2002.

At any given point in time, the pipelined first stage 54 and each of the subsequent stages 56 are processing a respective different sample of the analog input signal Vin. For example, focusing on successive hypothetical samples of the analog input signal Vin, when the last pipeline stage M is processing the first sample, the previous pipeline stage M-1 will be processing the second sample, the previous pipeline stage M-2 will be processing the third sample, and so forth (i.e., the pipeline stages process several samples in parallel or in other words, the converter apparatus 10 is pipelined).

Figure 4:
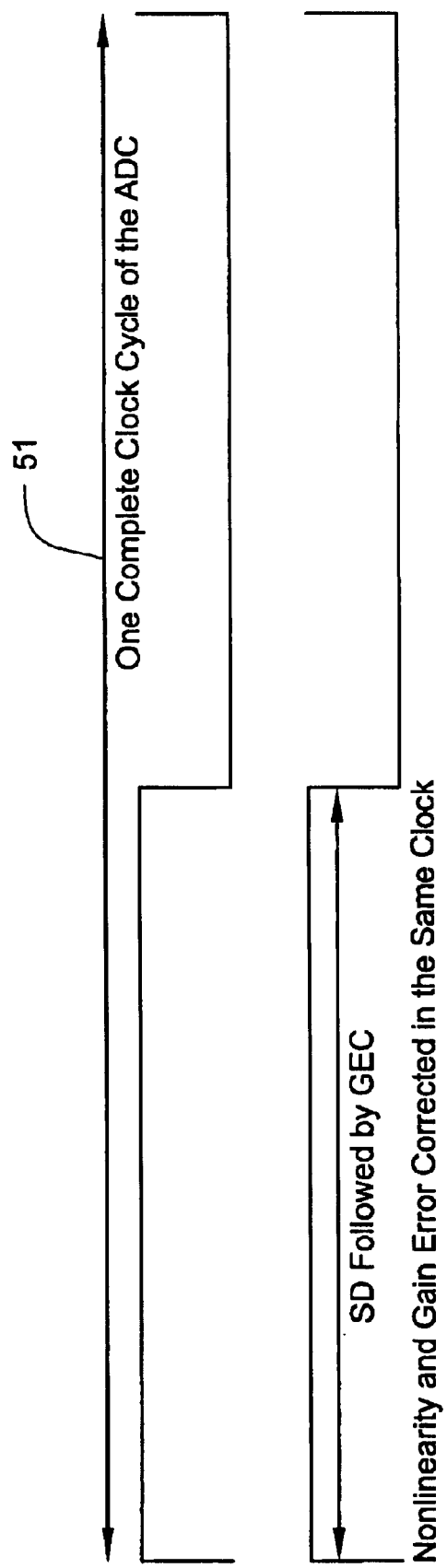
FIG. 4 is a timing illustration for use in describing the performance of nonlinearity and gain error correction according to the present invention.

Generally, for example, at least in one embodiment, the pipelined stages each have two clock inputs. A first clock signal is applied to one of the clock inputs of each pipeline stage, and a different clock signal is applied to the other clock input thereof. Generally, the order of the clock signals alternates from stage to stage. Further, for example, the clock signals have the same frequency, but are 180° out of phase with respect to each other. The timing associated with pipelined A/D converter apparatus is generally known and will not be described in detail herein. However, one complete clock cycle 51 of the A/D converter apparatus 50 is shown in FIG. 4 for use in describing nonlinearity and gain error correction that is concurrently performed in the same clock cycle. During each complete clock cycle, following a start up time period, a digital output Dout representative of the sampled input Vin is output.

The present invention focuses on correction of nonlinearity error (e.g., noise and non-ideal characteristic error) introduced into the A/D converter apparatus 50 by at least the DAC 62 of the first stage 54 and also the gain error introduce by at least the interstage amplifiers. Such nonlinearity error, at least in part, is introduced as a result of capacitor mismatch in the switched capacitor network used to provide the digital-to-analog conversion in the first stage 54. Further, for example, the gain error, at least in part, is introduced by capacitor mismatch in operational amplifier design, and also due to the finite open loop gain of operational amplifiers. In addition to the DEC 86, the one or more circuits 80 include at least a randomizer 82, subtractive dither (SD) logic 84 for use in the correcting nonlinearity error, and continuous gain error correction (CGC) logic 88 which as further described herein may be used to correct for the gain error.

Although the techniques described herein with respect to nonlinearity error correction are preferably applied to the first stage 54 only, such techniques may be applied as well to any of the other one or more subsequent stages 56. However, such application may increase the complexity for providing such nonlinearity error correction and/or providing gain error correction as further described herein. In addition, it would substantially appear that the effect of the first stage DAC introduced nonlinearity is far more significant than any of the nonlinearity introduced by the other DACs of any of the one or more subsequent stages 56. Therefore, preferably, removal of a substantial amount of nonlinearity associated with the first stage while providing a cost effective and less complex apparatus is preferred.

The one or more circuits 80 include circuitry for performing one or more of the following functions. For example, as further described herein, the randomizer 82 (e.g., pseudorandom sequence generator) is used to configure a capacitor switch network for use in implementing DAC 62 to perform the digital-to-analog conversion as described herein.

Further, subtractive dither logic 84 is used to correct for nonlinearity introduced into the A/D converter apparatus 50 by the first stage DAC 62. Generally, such non-linearity error may be corrected by any suitable method that permits gain error correction to be concurrently performed in a manner as described herein. Further, such non-linearity error correction may be performed in the analog and/or digital domain. However, preferably, the non-linearity error correction is performed in the digital domain. For example, the non-linearity error correction may be carried out by self-calibrating techniques such as described in Sculley et al., "A High Resolution Nonlinearity Correcting A/D Converter Architecture," IEEE Symposium on Circuits and Systems, pp. 1212–1215 (1993); Mayes et al., "A 200 mW, 1 Msample/s, 16-b Pipelined A/D Converter with On-Chip 32-b Microcontroller," IEEE J. Solid-State Circuits, vol. 31, no. 12, pages 1862–1872 (December 1996); and Sculley et al., "Nonlinearity Correction Techniques for High Speed, High Resolution A/D Conversion, IEEE TRANS. On Circuits and Systems—II: Analog and Digital Signal Processing, Vol. 42, No. 3, pp. 154–163 (March 1995). In such techniques, the correction is performed by use of precise inputs that are passed through the converter and a calibration DAC. Correction codes are determined and stored in random access memory to be added or subtracted from the actual inputs.

Further, for example, non-linearity correction may be carried out as described in Pelka et al., "Nonlinearity Correction of the Integrated Time-to-Digital Converter with Direct Coding," Precision Electromagnetic Measurements Digest, 1996 Conference, pp. 548–549. Nonlinearity correction for a time-to-digital converter using direct coding is described. The error is identified and corrected by a trained neural network.

However, such techniques may be somewhat complex to implement. Further, these techniques may not meet speed requirements necessary for satisfying various requirements such as those necessary for converters used in communication systems (e.g., receivers thereof).

Preferably, such non-linearity error correction is implemented by continuously averaging over a plurality of samples or time cycles the first stage digital residue signal D(R0) (e.g., the one or more digital outputs D2-DM) from the one or more subsequent stages 56. Preferably, the averaging of the first stage digital residue signal is implemented by continuously averaging the first stage digital residue signal with a pseudorandom sequence resulting in an averaged first stage digital residue correction signal to be used for correction of the nonlinearity. Preferably, the pseudorandom sequence is based on the pseudorandom sequence used in the DAC 62 to perform the digital to analog conversion. A substantially similar technique is described in U.S. Patent Application Publication 2002/0041248 A1 to Galton, entitled "Digital Cancellation of D/A Converter Noise in Pipelined A/D Converters," published 11 Apr. 2002.

With non-linearity corrected by the SD logic 84, the CGC logic 88 is used to correct for gain error in the pipelined A/D converter apparatus 50. Generally, such gain error may be corrected by any suitable method that permits both the gain error correction and the nonlinearity error correction to be concurrently performed in a manner as described herein. Further, such gain error correction may be performed in the analog and/or digital domain. However, preferably, the gain error correction is performed in the digital domain. For example, the gain error correction may be carried out using a proration technique as described in Lee, et al., "Interstage Gain Proration Technique for Digital-Domain MultiStep ADC Calibration," IEEE TRANS. On Circuits and Systems—II: Analog and Digital Signal Processing, Vol. 41, No. 1, pp. 12–18 (January 1994). As described therein, digital calibration of the gain error is done by the proration technique. A table of errors is created from each stage for use in correcting the gain error.

Preferably, such gain error correction is implemented by continuously averaging over a plurality of samples or time cycles the nonlinearity corrected digital output signal (e.g., that signal provided after use of the subtractive dither logic 84 to correct for nonlinearity).

General operation of at least one embodiment of the A/D converter apparatus 50 shall be described with reference to FIG. 3. Although the operation of the A/D converter apparatus 50 shall be described with reference to FIG. 3 and use of nonlinearity correction that involves the averaging of digitized residue with a pseudorandom sequence, other nonlinearity error correction techniques for correcting the nonlinearity in the first stage 54 may be used in conjunction with the continuous gain error correction described herein.

The linearity of the overall A/D converter apparatus 50 is mainly affected by the nonlinearity, offset, and gain errors in the DAC 62 of the first pipeline stage 54 and interstage amplifiers, particularly amplifier 57 between first stage 54 and one or more subsequent stages 56. Preferably, according to the present invention, nonlinearity error correction (otherwise referred to herein as dynamic noise cancellation) and gain error correction are performed concurrently. In other words, both the nonlinearity error correction and gain error correction techniques are preferably run simultaneously over time for the A/D converter apparatus 50. Such concurrent operation of the error correction techniques simplifies the clocking mechanism for the apparatus 50 as special timing considerations do not need to be addressed. Also, as both nonlinearity and gain error correction are performed simultaneously, after the initial ramp up time, the output obtained is corrected, continuous and performed in the digital domain. This provides relief from the use of analog circuitry in the design.

By using the techniques concurrently, nonlinearity and gain error can be reduced; for example, the errors associated with the first stage 54, which is a main error contributor to the overall converter apparatus 50. A nonlinearity correction technique, such as that described in U.S. Patent Application Publication 2002/0041248 A1 to Galton, used by itself corrects for nonlinearity in a DAC of a first stage of an A/D converter apparatus, but does not correct for gain error. Hence, the technique increases the dynamic range only if the contribution from the gain error is minimal.

Figure 5:
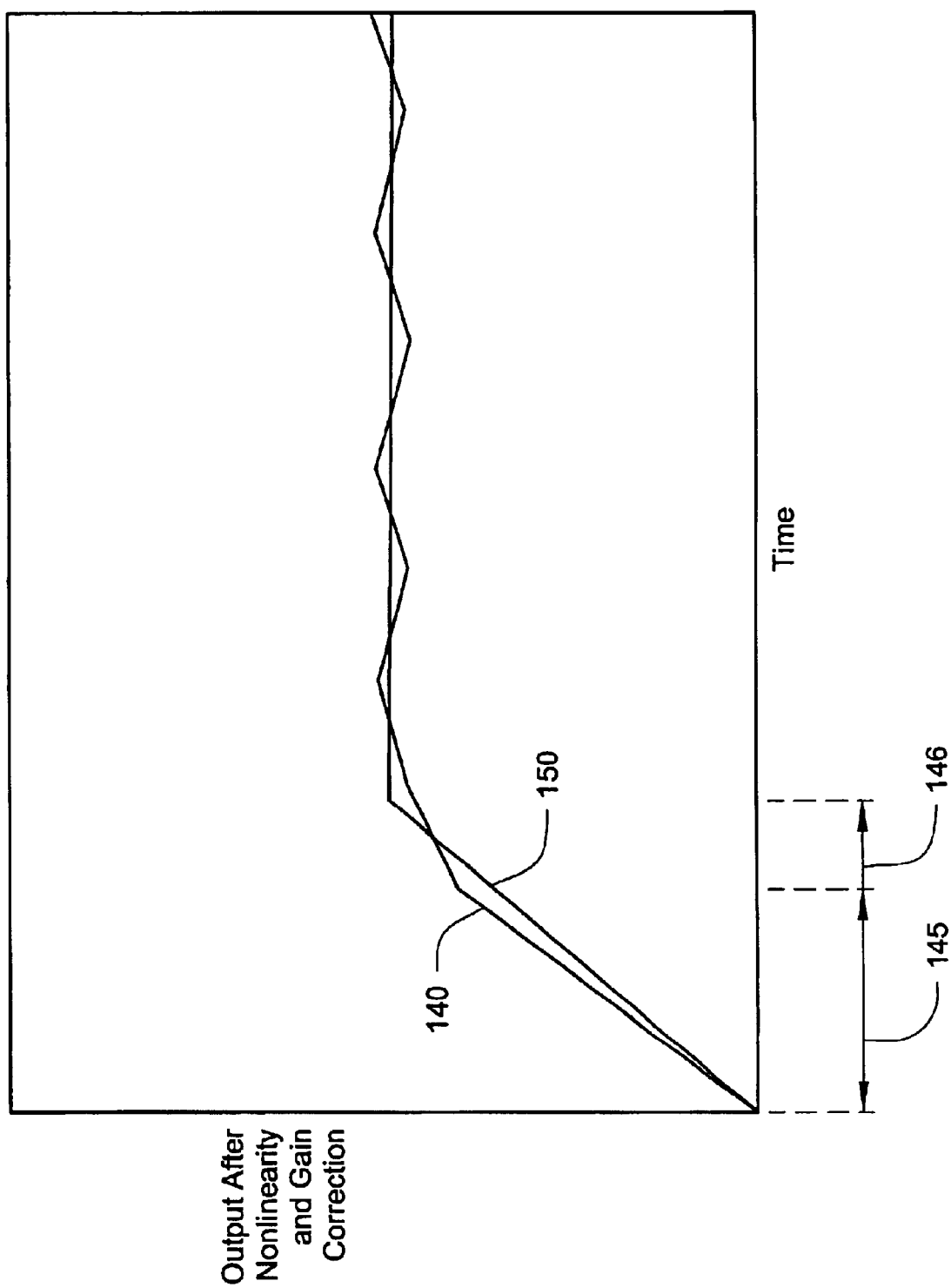
FIG. 5 is a graph for use in describing the performance of nonlinearity and gain error correction according to the present invention.

Further, the calibration technique, described in the article by E. J. Siragusa and I. Galton, entitled "Gain error correction technique for pipelined analogue-to-digital converters" is used to remove gain error, or in other words, is a gain error correction technique. However, it works on the premise that the gain error is the dominant source of error in the system. Both of these techniques described in the Background of the Invention section herein utilize an averaging of the digitized residue of the pipelined A/D converter with a known pseudorandom sequence to estimate the nonlinearity and gain error, respectively, but separately. For example, an output 140 after nonlinearity and gain correction are performed separately during different clock cycles in an A/D converter is shown in FIG. 5. As shown therein, following an initial start-up time 145 for the pipeline to fill, nonlinearity is corrected without accounting for gain error and, thereafter, gain error is corrected without taking into account nonlinearity resulting in an output that still has significant error.

According to the present invention, both nonlinearity error correction and gain error correction operate concurrently or simultaneously to give a desired increase in SFDR. FIG. 5 shows an exemplary output 150 according to the present invention after an initial start-up time 146 and after nonlinearity and gain error correction are performed according to the present invention.

One will recognize that unless nonlinearity error correction and gain correction are performed concurrently or simultaneously during the same clock cycle, either nonlinearity error or gain error will still be contributing error to the output of the converter as shown by output 140 in FIG. 5. In contrast, according to the present invention, because non-linearity error and gain error correction are concurrently performed, or in other words, during each clock cycle gain error correction and nonlinearity correction are implemented, SFDR can be increased.

As described herein, operation concurrently or simultaneously refers to the implementation of such error correction in the same clock cycle. In other words, one will recognize that following the initial start-up time 146, after each clock cycle, a digital output that is corrected for both gain error and nonlinearity error is provided, and further that such correction is performed during each clock cycle until the last sample is operated on by the nonlinearity error correction techniques. In other words, for example, operation of the GCG logic 88 and SD logic 84 are continuously and concurrently operating during a plurality of clock cycles to provide a corrected Dout for the A/D converter apparatus 50.

Figure 3:
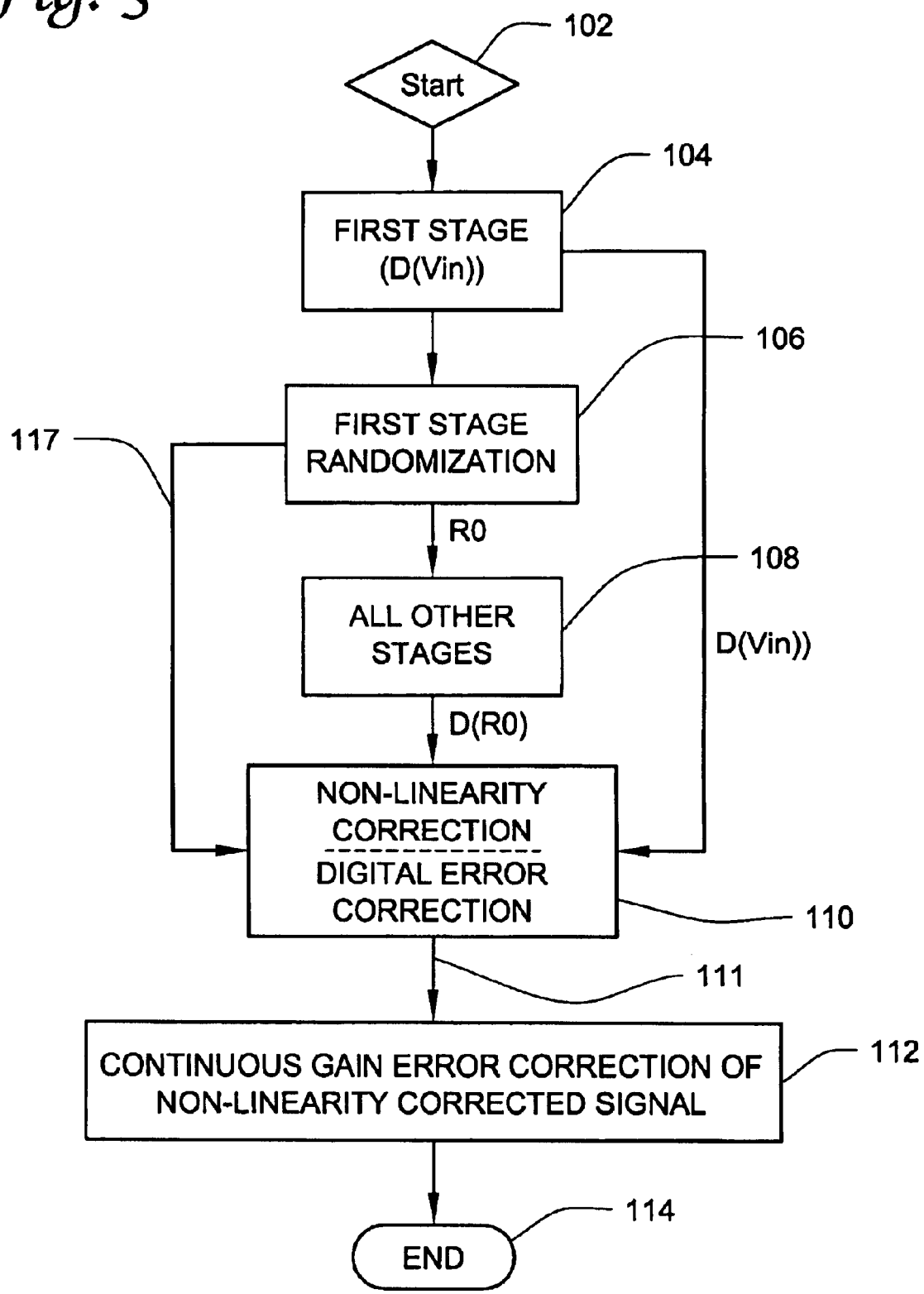
FIG. 3 is a general flow diagram illustrating operation of the pipelined A/D converter apparatus shown generally in FIG. 2 according to the present invention.

As shown in FIG. 3, the conversion process is started (block 102) as the input Vin is sampled and applied to first stage 54 as shown in block 104. The first stage 54 provides for an analog-to-digital conversion of the sampled Vin to provide 30 a first stage digital output D(Vin) as shown generally by block 104. The first stage digital output signal D(Vin) is later combined with one or more other digital outputs D(R0) from the one or more subsequent stages 56 representative of the first stage digital residue for use in providing a corrected digital output signal 111 to block 112 for application of continuous gain error correction.

The first stage digital output signal D(Vin) is also provided from the ADC 60 to DAC 62 where the first stage digital output signal D(Vin) is reconverted to an analog signal for subtraction (e.g., via summing node 64) from the sampled Vin applied to first stage 54 to obtain the first stage analog residual signal R(0). Such reconversion or digital to analog conversion of D(Vin) conventional performed using a randomizer 82 to provide for randomization of the capacitors of the switched capacitor network used to implement DAC62.

In other words, such digital to analog conversion of D(Vin) to an analog signal by DAC 62 is generally performed using a switched capacitor network under control of the bits of D(Vin). The capacitors of the network generally have equal values, but in the non-ideal implementation, such capacitors are not precisely equal. If the same capacitors are controlled by the same bits over and over, because of the imprecision, a nonlinearity would be introduced into the output that would produce undesirable harmonics in the signal. As such, a pseudorandom sequence indicative of the selection of capacitors of the switched capacitor network to be used to provide the converted D(Vin) is provided by the randomization 106. In other words, the randomizer 82 randomizes the D(Vin) to provide a random D(Vin) for use in generating the residue R(0) as shown in block 106. The first stage analog residue R(0) is provided with amplification (e.g., amplifier 57) and applied to the second stage of the other subsequent stages 56 as shown by block 108.

The pseudorandom sequence (e.g., randomized bits) from the first stage randomization (block 106) is provided for use by nonlinearity correction logic of block 110 as shown by line 117. Further, the first stage analog residue signal R(0) is digitized by the one or more subsequent stages 56 as shown generally by block 108. With the first stage residue signal R0 digitized, the first stage digital residue signal D(R0) is also applied to the nonlinearity correction block 10.

Nonlinearity can then be estimated by averaging the pseudorandom sequence from first stage randomization 106 with the first stage digital residue signal D(R0) resulting in an averaged first stage digital residue correction signal. The averaged first stage digital residue correction signal (i.e., determined by SD logic 84) can be subtracted from a sum of the first stage digital residue signal D(R0) and the first stage digital signal D(Vin) resulting from the analog-to-digital conversion performed by ADC 60 of the first stage 54. The DEC logic 86 is used to align the bits of the digital outputs from the first stage 54 and the other subsequent stages 56 (also shown generally as block 110).

The subtraction may be carried out either before the DEC logic 86 has combined first stage digital output D(Vin) with the digital outputs of the subsequent stages 56 (i.e., the correction being made to D(R0) or, in other words, the combined digital outputs of the stages 2-M) or the subtraction may be carried out after the first stage digital output D(Vin) has been added to the D(R0). Such subtraction and combining of the digital outputs results in a nonlinearity corrected digital output signal 111.

The nonlinearity corrected digital output signal 111 is provided for continuous gain error correction (block 112). For example, such gain error correction is preferably provided by the continuous averaging, over a plurality of samples, of the nonlinearity corrected digital output signal 111. Such averaging of the nonlinearity corrected digital output signal 111 to correct for gain error is performed concurrently with the averaging of the first stage digital residue signal D(R0) with the pseudorandom sequence resulting in the averaged first stage digital residue correction signal for use in correcting nonlinearity introduced by DAC 62.

In other words, following an initial start-up time 146 during which the pipeline is being filled, the first digital output signal Dout representative of the first sample of Vin is provided at the output of the A/ID converter apparatus 50. Each following clock cycle provides additional digitized outputs representative of subsequent samples of Vin that are corrected for both nonlinearity error and gain error. In other words, such nonlinearity and gain error correction techniques are performed concurrently to provide a pipelined output. The conversion is completed (block 114) upon providing an output representative of the last sample.

Generally, the one or more circuits 80 and/or other portions of the present invention may be implemented in various manners. For example, one or more of an application specific integrated circuit (ASIC), a digital signal processor (DSP), a controller, a microprocessor, or other hardware/software configurations designed to perform the functions described herein may be used. For example, the signal processing may be implemented in the form of logic circuits, may be processor-based circuitry, and/or can be performed by software codes executed on a processor, or a combination of hardware and software codes.

In one exemplary embodiment, as shall be described further herein, the one or more circuits 80 may be implemented in the form of a field programmable logic array (FPGA). However, one skilled in the art will recognize that any hardware/software configuration capable of performing the functionality as described herein may be used to implement the present invention.

Further, one skilled in the art will recognize that any number of circuits may be used to implement the stages of the A/D converter as well. For example, one will recognize that the initial stage 54 may be implemented using switch capacitor networks, voltage comparators, amplifiers, etc.

Figure 6:
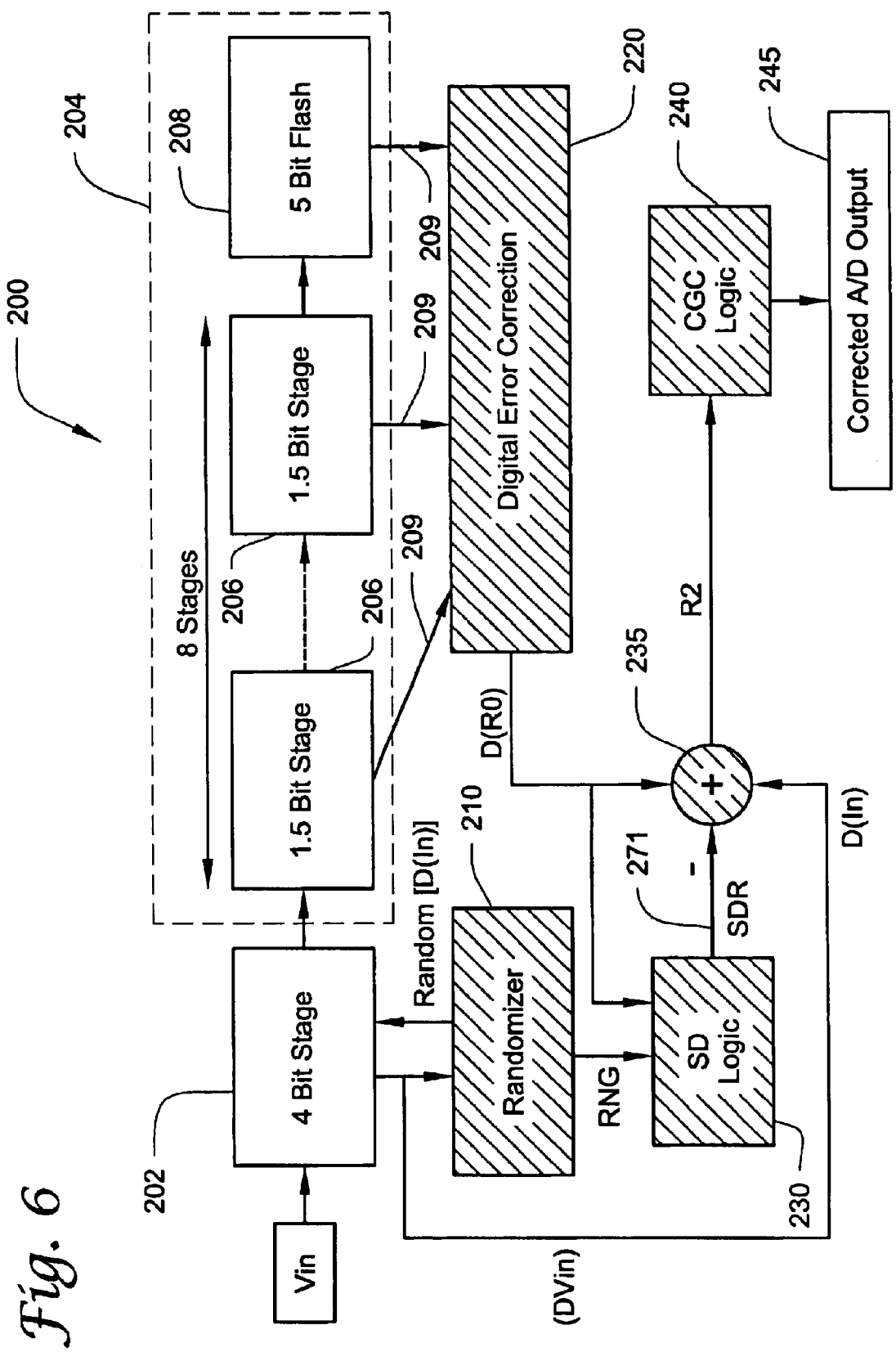
FIG. 6 is one illustrative exemplary embodiment of a 16-bit pipelined A/D converter apparatus including nonlinearity and gain error correction according to the present invention.
Figure 7:
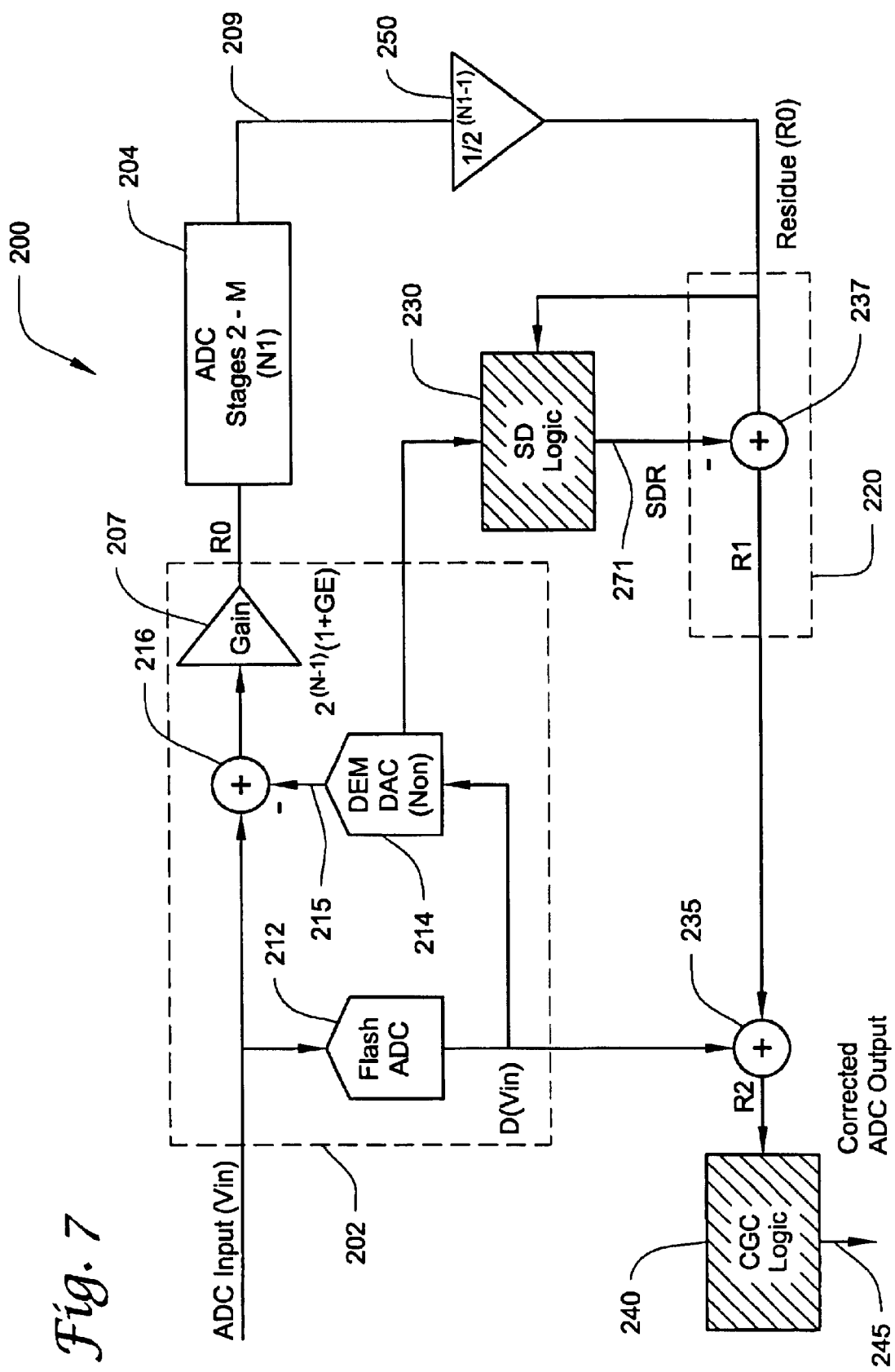
FIG. 7 is a generalized version of the 16-bit pipelined A/D converter apparatus of FIG. 6 for use in describing the nonlinearity and gain error correction techniques used therein.

The present invention shall be more clearly understood from the detailed description for a 16-bit pipeline converter apparatus 200 shown in block form in FIG. 6 and with reference to embodiments thereof shown in FIGS. 7–12. The 16-bit pipelined converter 200 shown in FIG. 6, and more generally shown in FIG. 7, includes 10 pipelined stages. In other words, as shown in FIG. 7, M=10.

The pipelined stages include an initial 4-bit stage 202 and one or more subsequent stages 204. The one or more subsequent stages 204 include eight 1.5-bit stages 206 and a terminating 5-bit flash stage 208. Although a 4-bit first stage 202 is used, an N-bit first stage, where N is an integer between 3 and 6, may also be used to implement the converter. A smaller bit first stage is preferably used so that the input capacitance is smaller, which in turn, affects the noise of the system. However, a 4-bit stage is chosen as a compromise between noise, input capacitance and the number of further stages that are to be used.

The 1.5 bit stages are used to include some redundancy. However, any suitable size stage greater than 1 may be used. 1.5 bit stages are used so as to have some overlap for operation of DEC logic 220. Larger bit sizes were not used because of the existing knowledge and ease of operation of the 1.5 bit stage. However, a converter having any number of stages of any number of bit resolutions may benefit from the present invention.

Portions of the pipelined converter apparatus 200 are analog, and portions are digital. The digital portions as shown in FIGS. 6 and 7 are cross-hatched, while the analog portions in such figures are not. For example, as shown in FIG. 6, preferably, the randomizer 210, DEC logic 220, SD logic 230, and CGC logic 240 are digital portions of the pipelined A/D converter apparatus 200. On the other hand, the stages are generally implemented as analog circuitry.

The first stage 202 and the subsequent 8 stages 206 each incorporate a flash ADC 212 and a switched capacitor DAC 214. The final 5-bit stage 208 includes only a flash ADC, as a residue is not generated for use by any subsequent stage.

The flash ADCs 212 of the stages may include any number of low voltage comparators that are suitable for comparing the voltage at the input of the stage to a set of reference voltages for use in providing a flash analog-to-digital conversion of a sampled input received thereby. For example, the flash ADC 212 is a 4 bit or a 17-level flash ADC.

The digital outputs of each ADC 212, digital output D(Vin) provided by the first stage 202 and digital outputs 209 provided by the eight 1.5 bit stages 206 and terminating 5-bit stage 208, are typically a set of comparator outputs. Generally, this type of digital encoding is referred to as thermometer encoding, and the digital value of each ADC output is interpreted as the number of its comparator outputs that are high. In at least one embodiment, prior to any digital processing of the digital outputs of each flash ADC 212 of each of the first stage 202 and/or the subsequent stages 204, thermometer encoded data is converted to binary encoded data in a thermometer to binary converter (not shown).

The DACs 214 of each stage are preferably implemented using switched capacitor networks that share a common summing node. Generally, the DAC 214 of each stage is driven by comparator outputs from the flash ADC 212 that have been randomized. In each stage, except for the last, the difference between the sampled input Vin and a reconstructed analog output 215 from DAC 214 representative of the digital output D(Vin) is provided to interstage gain amplifier 207. In other words, for example, with reference to the first stage 202, the analog residue of the first stage R0 is amplified by gain amplifier 207 for application as the input to a 1.5-bit stage 206 of the one or more subsequent stages 204. Preferably, the interstage gain is equal to $2^{(N-1)}$, where N is equal to the resolution of bits in the stage. In addition, a gain error is introduced into the system by the gain amplifier 207 equal to (N−1)(GE) as shown in FIG. 7, where GE is the gain error.

It will be recognized, as previously described herein, that the DAC 214 of the first stage introduces nonlinearity error into the A/D converter apparatus 200 which must be removed. In fact, the DAC of each stage introduces nonlinearity into the apparatus 200. However, as performance tends to be more dependent on the first stage, and complexity for correcting the nonlinearity error in more than the first stage is quite high, the present invention preferably only corrects the nonlinearity error introduced by the first stage 202.

Further, the gain error associated with the interstage gain amplifier 207 of the first stage 202 which provides the amplified analog first stage residue signal R0 to the subsequent stages 204 (and other interstage amplifiers) is also considered to be sufficiently significant to degrade conversion performance. As such, the following technique is used to correct for both nonlinearity error and gain error in the pipelined A/D converter apparatus 200.

Improved performance can be obtained by digitally removing from the pipelined A/D converter apparatus 200 nonlinearity error components resulting from capacitor mismatch of capacitors used to implement the DAC 214 of the first stage 202. A digital noise cancellation technique described in U.S. Patent Application publication US 2002/0041248 A1 to Galton is preferably used to provide for nonlinearity correction and is implemented by the SD logic 230.

Figure 9:
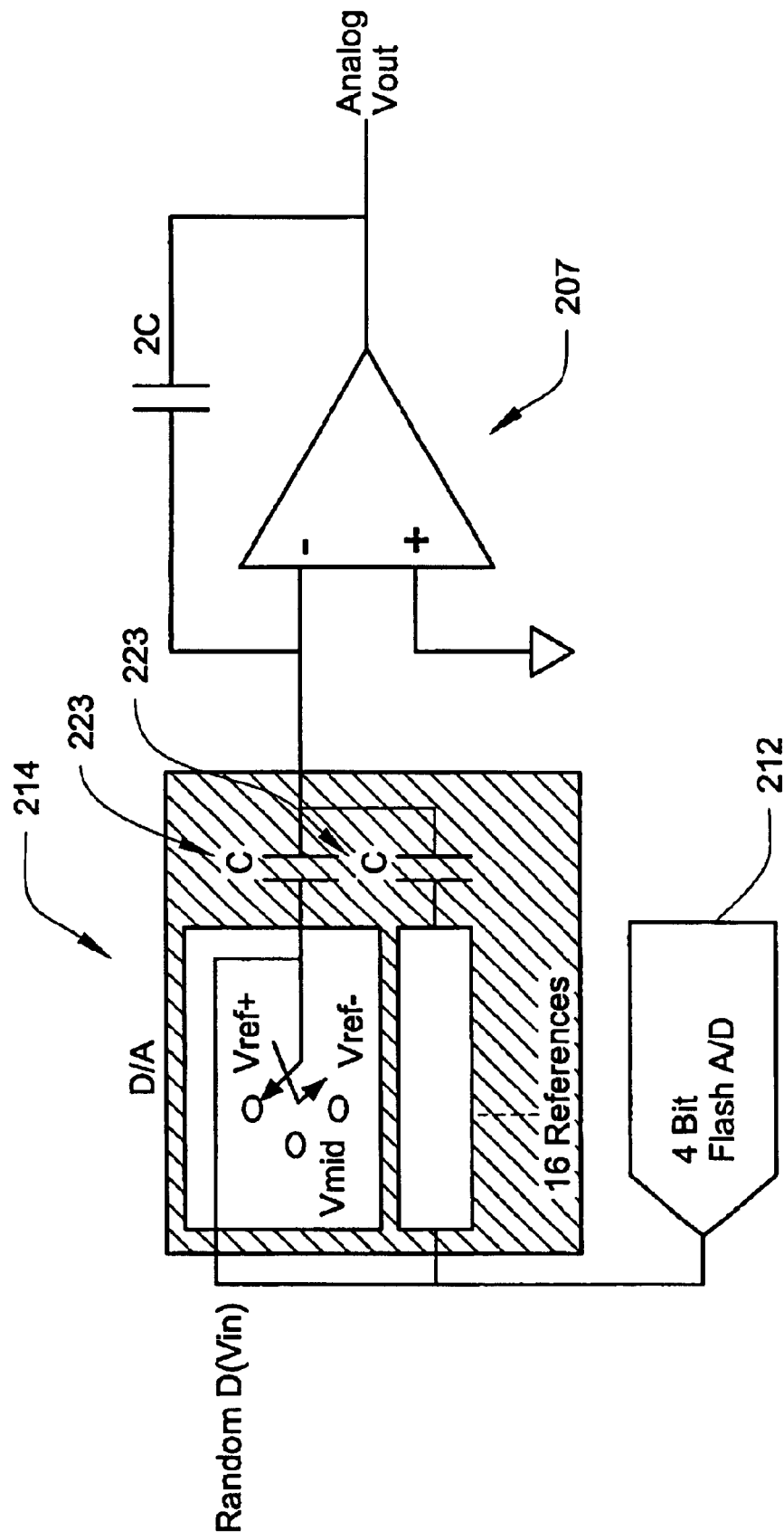
FIG. 9 is a more detailed diagram of a DAC portion of the first stage of the 16-bit pipelined A/D converter apparatus of FIG. 6.

The DAC 214 is shown in a further level of detail in FIG. 9. The DAC 214 is referred to as a dynamic element matching (DEM) DAC and is implemented with a plurality of switched capacitor circuits 223 (i.e., switched capacitor one-bit DACs). Preferably, sixteen switched capacitor circuits are used for a fully differential pipeline design and are designed as described in "Performance limitations on high-resolution video-rate analog-digital interfaces," Yuh-Min Lin, Memorandum no UCB/ERL M90/55 (June 1990).

The DEM DAC 214 is configurable using the randomization of the D(Vin). For example, the randomizer 210 (e.g., a digital encoder) as shown in FIG. 6 receives D(Vin) and randomly permutes the encoded bits (e.g., the comparator outputs of the ADC 212) to provide a random D(Vin) to be used to configure the switched capacitor circuits 223 of DAC 214. In other words, a pseudorandom sequence is provided for randomization to determine which of the switched capacitor circuits are operational, and as such, which are to be used to provide a proper digital-to-analog conversion of the first stage digital output D(Vin) from flash ADC 212. The operation of such randomization is described in U.S. Patent Application Publication No. US 2002/0041248 A1. Such randomization shall not be described in detail herein, however, generation and use of such pseudorandom sequence (e.g., random and parity bits) is generally described below for correction of nonlinearity in the first stage 202 of the A/D converter apparatus 200.

As indicated in U.S. Patent Application Publication No. US 2002/0041248 A1 the DAC noise (e.g., nonlinearity) in each DEM DAC 214 includes, for example, a sum of 15 terms corresponding to the switched capacitor circuits. Each term is the product of a constant and a unique modulation sequence (referred to herein as a pseudorandom sequence). The constant depends only upon the one-bit DAC errors. The modulation sequence is restricted to the values 0, and 1, and its sign varies randomly such that it is uncorrelated with the other modulation sequences and with the pipelined ADC input signal Vin. The modulation sequences associated with DEM DAC 214 is generated and made available to the SD logic 230 as digital signals for use in non-linearity correction.

SD logic 230 generates an estimate of the non-linearity error (i.e., referred to as DAC noise in U.S. Patent Application Publication No. US 2002/0041248 A1) by combining the 15 estimated constants and the 15 known modulation sequences. Each constant is estimated by multiplying first stage digital residue D(R0) by the corresponding modulation sequence and averaging the non-zero components of the resulting sequence. As shown below, the average converges to the desired constant because the modulation sequence is uncorrelated to all but the term containing the constant.

The high-level topology of a DEM DAC 214 is similar to that shown in FIG. 4 of U.S. Patent Application Publication No. US 2002/0041248 A1. The digital encoder is comprised of the tree structure of 15 digital blocks labeled $S_{k,r}$, where k=1, . . . , 4 and r=1, . . . , 8. These blocks are referred to as switching blocks that control the voltage output blocks e1–e8 (together referred to as numeral 403). As indicated therein, and as shown in the illustrative 3-bit exemplary DEM DAC structure 400 in FIG. 12, each pair of input bits is passed through a swapper cell that either passes the bits straight through to the output 406 or interchanges their order depending upon whether a random control bit, $q_{3,1}[n]$, is high or low. See L. R. Carley and J. Kenney, "A 16-bit 4'th order noise-shaping D/A converter," IEEE Proc. CICC, pp. 21.7.1–21.7.4, 1988. See also L. R. Carley, "A noise shaping coder topology for 15+bits converters," IEEE Journal of Solid-State Circuits, vol. SC-24, pp. 267–273, April 1989. See finally T. W. Kwan, R. W. Adams and R. Libert, "A stereo multibit Sigma Delta DAC with asynchronous master-clock interface," IEEE Journal of Solid-State Circuits, vol. 31, no. 12, pp. 1881–1887 December 1997.

All the swapper cells in a given switching block 402 share the same random control bit, so the effect of each switching block is to pass all the even numbered input bits to the top output and all the odd numbered input bits to the bottom output, or vice versa, depending upon whether the random control bit is high or low. Each switching block, $S_{k,r}$, contains logic that sets a parity bit, $O_{k,r}[n]$, high if there are an odd number of input bits to the switching block that are high, and sets it low otherwise. The 15 parity bits and 15 random control bits associated with DEM DAC are used by the SD logic 230 in estimating the nonlinearity error arising from the DAC noise, as will be described herein (e.g., generation of a first stage digital residue correction signal SDR or in other words, the error obtain after the SD logic 230 is applied).

As shown in FIG. 6, the SD logic 230 associated with the first stage 202 receives two inputs, one from the randomizer 210 and a second that provides D(R0) (i.e., the digitized first stage residue) representative of the combined digital outputs of the subsequent stages 204 (i.e., digital outputs from the eight stages 206 and terminating stage 208). The input from the randomizer 210 includes pseudorandom sequence RNG that, for example, includes the 15 random bits, $\{q_{k,r}[n]\}$, and the 15 parity bits, $\{o_{k,r}[n]\}$, described above.

The SD logic 230 performs generally the same functionality as described in U.S. Patent Application Publication No. US 2002/0041248 A1. Generally, at least in one embodiment, to estimate the first stage digital residue correction signal, SDR, a 10-bit random number is added to the digitized residue D(R0), and the result is requantized to a three-level sequence (e.g., the quantizer acts as an ideal unity-gain mid-tread quantizer followed by a scale factor of 2.) The remainder of the SD logic 230 includes 15 parallel channels that all operate on the three level signal from the requantizer. The outputs of the channels are added together to generate the estimate of the non-linearity error (e.g., the error arising from the noise introduced by the first-stage DEM DAC 214).

Figure 10:
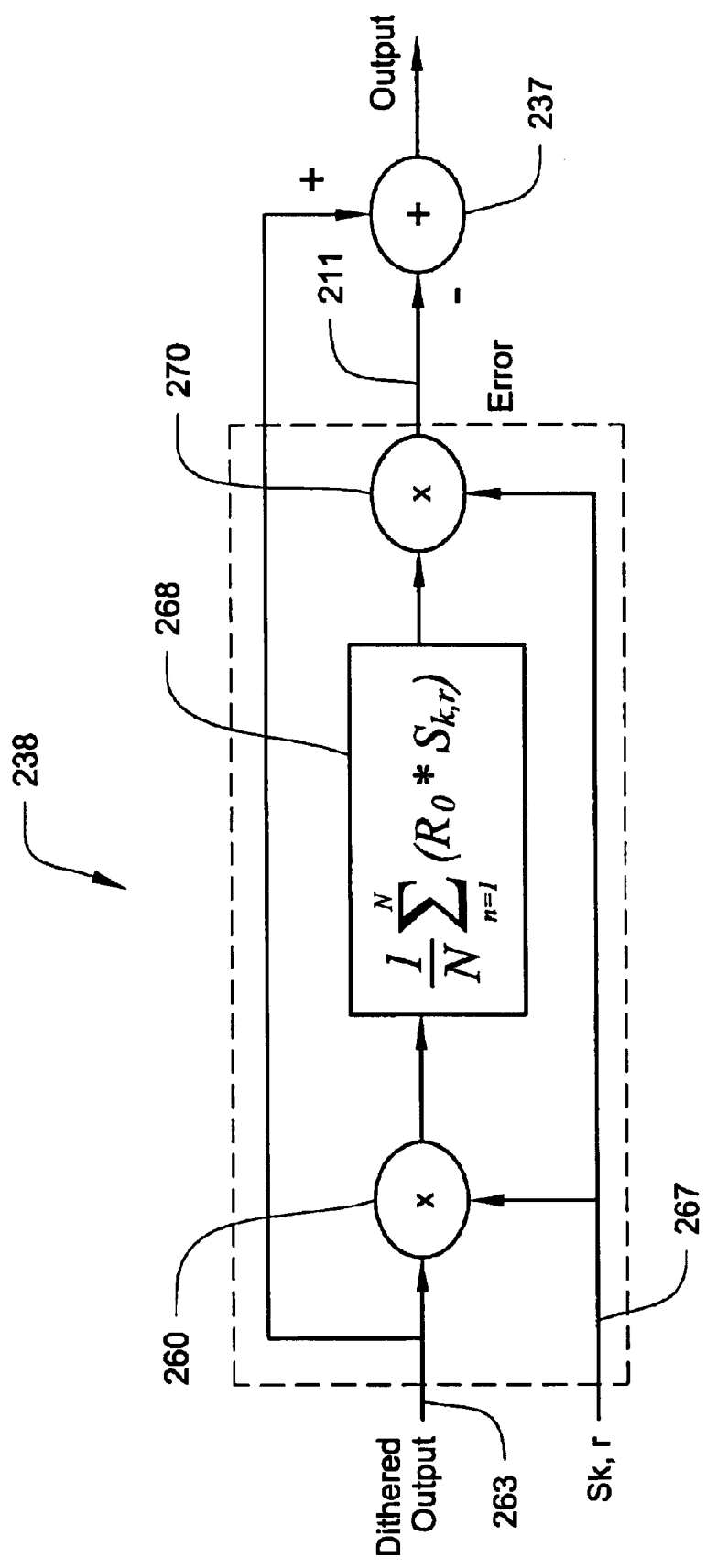
FIG. 10 is a block diagram of one embodiment of subtractive dither (SD) logic as shown generally in, for example, FIG. 6 and FIG. 7 for use in correcting nonlinearity.
Figure 11:
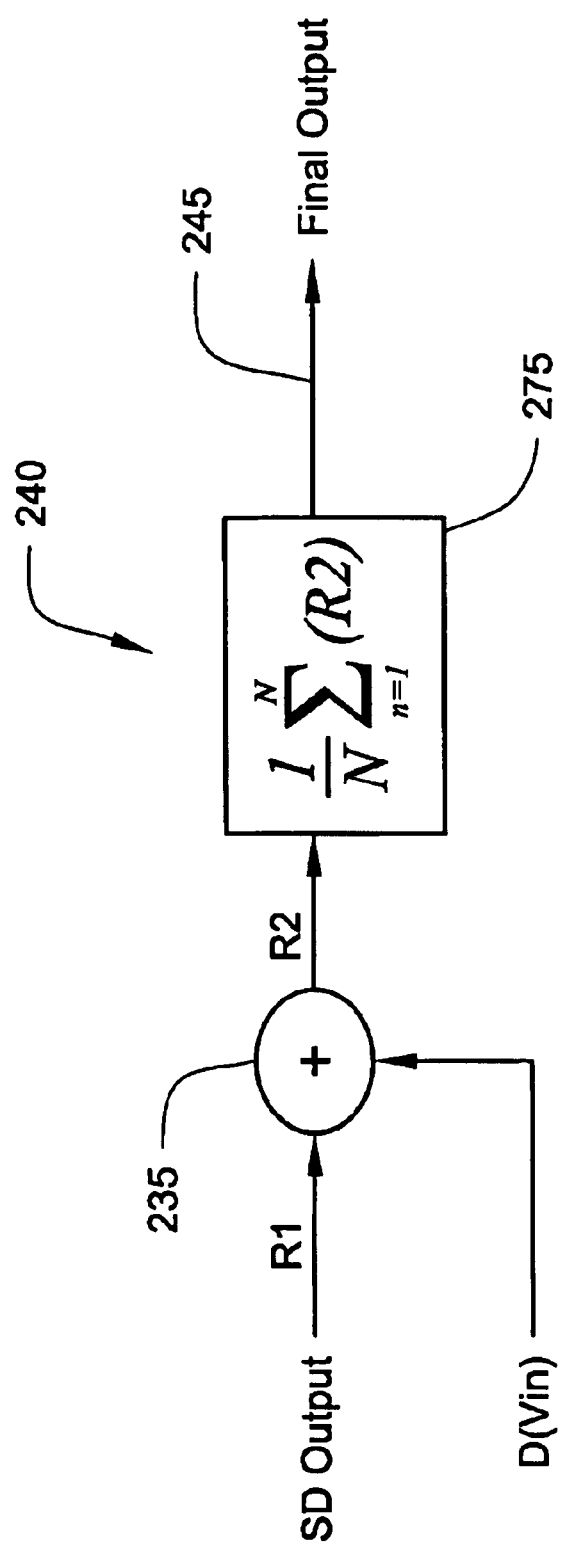
FIG. 11 is an exemplary embodiment of continuous gain error correction (CGC) logic as shown generally in, for example, FIG. 6 and FIG. 7 for use in correcting gain error according to the present invention.

In general, the pseudorandom sequence from randomizer 210 used for the digital-to-analog conversion performed by DAC 214 is provided to SD logic 230 for generating an averaged first stage digital residue correction signal. A block diagram of the SD logic 230 is shown in FIG. 10. A dithered first stage digital residue signal R0 is applied to input 263. The dithered first stage digital residue signal R0 is then averaged with the pseudorandom sequence $s_{k,r}$ applied at input 267 using multiplier 260, averaging block 268, and multiplier 270. The result is the averaged first stage digital correction signal SDR at output 271 which can be subtracted from the first stage digital residue D(R0) to correct for nonlinearity error.

Such averaging of the residue with the pseudorandom sequence is described in U.S. Patent Application Publication No. US 2002/0041248 A1. For example, each channel corresponding to one of the switching blocks in the first-stage DEM DAC 214 is averaged. The three-level input to each channel is first effectively multiplied by 1, 0 or –1, or, depending upon the states of the random bit and the parity bit from the corresponding switching block of the DEM DAC 214 as shown by the multiplier 260 in FIG. 10. The resulting sequence is operated on by a channel averager, and the output of each averager is subjected to the same 1, 0 or –1 multiplication as applied to the sequence at the input to the channel (as shown by the multiplier 270 in FIG. 10). Each averager samples its input sequence each time the parity bit, $o_{k,r}[n]$, is high, and adds the value to that of an internal accumulator.

Each time a particular number of samples (e.g., $2^{25}$ samples, as described in U.S. Patent Application Publication No. US 2002/0041248 A1), have been accumulated, the averager updates its output register with the accumulated value divided by, for example, the number of samples, to provide the averager output. The output may be truncated. The accumulator is cleared and begins the accumulation process again; the output register is not updated again until the next particular number of samples have been accumulated.

As described in U.S. Patent Application Publication No. US 2002/0041248 A1, a hardware-efficient implementation of each averager may include the use of an up/down counter to perform the accumulation, and an up-counter to determine when each complete set of samples has been accumulated.

Preferably, according to the present invention, the averaging is performed in a FPGA. As such, the apparatus is programmable to set the numbers of samples to be averaged. This provides for increased flexibility in the overall design.

The randomness properties of the $q_{k,r}[n]$ sequences facilitate the estimation by the SD logic 230 of the DAC nonlinearity from the residue and the pseudorandom sequences $s_{k,r}[n]$. The SD logic 230 operates in a fashion similar to a spread-spectrum receiver to estimate the non-linearity error. In general, the SD logic 230 averages the product of the corresponding $s_{k,r}[n]$ sequence and the digitized residue of the first stage, R1(n), over a large number of sample times, n, for which $|s_{k,r}[n]|=1$.

Subtracting the averaged first stage digital correction signal SDR from the output of the pipelined A/D converter apparatus 200 cancels most of the error arising from DAC nonlinearity introduced by the DEM DAC 214 of the first stage 202. The accuracy with which the error is canceled depends at least on the number of samples averaged.

At least in one embodiment, the SD logic 230 performs dithered requantization of the digitized residue in order to simplify the averager hardware. The 10-bit random sequence added to the digitized residue is used as a dither sequence. See A. B. Sripad and D. L. Snyder, "A necessary and sufficient condition for quantization errors to be uniform and white," IEEE Trans. Acoust. Speech Signal Processing, vol. ASSP-25, pp. 442–448, October 1977. See also R. M. Gray and T. G. Stockham Jr., "Dithered quantizers," IEEE Trans. Inform. Theory, vol. 39, no. 3, pp. 805–812, May 1993.

As described above, the result of the above averaging technique to determine nonlinearity error is an averaged first stage digital correction signal SDR 271 that can be subtracted from the first stage digital residue D(R0) to correct for the nonlinearity error introduced by DAC 214. The corrected first stage digital residue signal can then be summed with the digital signal D(Vin) from flash ADC 212 to provide a nonlinearity corrected output signal R2.

Figure 12:
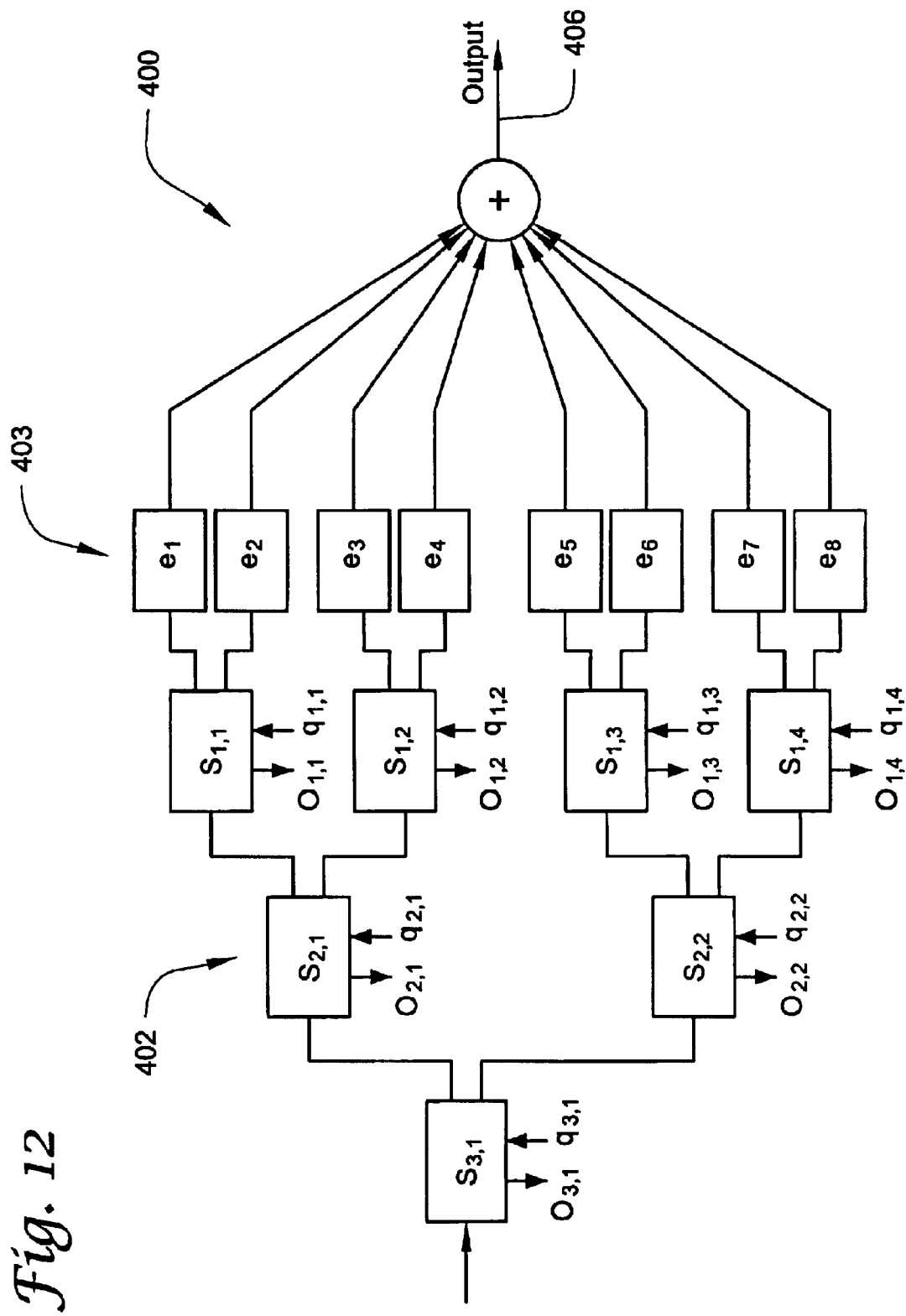
FIG. 12 is an exemplary embodiment of a tree structure for use in describing the DAC portion of FIG. 8 according to the present invention.

With the nonlinearity corrected, the nonlinearity corrected digital output signal R2 is applied to CGC logic 240 which averages the nonlinearity corrected digital output signal R2 to correct for gain error. In one exemplary embodiment of the CGC logic 240, a block diagram of the CGC logic 240 including an averager 275 is shown in FIG. 12.

The averager 275 receives the nonlinearity corrected digital output signal R2, averages the output signal R2 over a plurality of samples, and provides a gain and nonlinearity corrected A/D converter apparatus output Dout at output 245. Preferably, the averager 275 is implemented by programming an FPGA to perform an accumulation over a set of samples and then dividing by the number of samples (e.g., the more the number of samples, the better the technique functions). In other words, implementation of the averager using an FPGA makes the averager design programmable. However, any implementation thereof may be used. For example, counters may be used to perform the functionality.

One will recognize that the nonlinearity error SDR obtained from the SD logic 230 may be either subtracted directly from the digital residue R1 and then combined or summed with D(Vin) resulting in the nonlinearity corrected output signal R2. In this manner, DEC logic 220 does not operate upon D(Vin) from the first stage 202 but only operates on the digital outputs of the subsequent stages 204.

On the other hand, the nonlinearity error SDR may be subtracted from a combined digital output provided by DEC logic 220 that includes the digital output D(Vin) from the first stage 202 as well as the digital outputs 209 from the other subsequent stages 204. As previously described herein, the DEC logic 220 aligns the digital outputs using a series of delays and/or shift registers in a conventional manner.

General operation of the A/D converter apparatus 200 shown in FIGS. 6 and 7 shall be described with reference to the flow diagram of FIG. 8. According to the present invention, nonlinearity error correction and gain error correction are performed concurrently. In other words, both the nonlinearity error correction and gain error correction techniques are preferably run simultaneously over time (i.e., or a plurality of clock cycles) for the A/D converter apparatus 200. By using the techniques concurrently, nonlinearity and gain error can be reduced.

Figure 8:
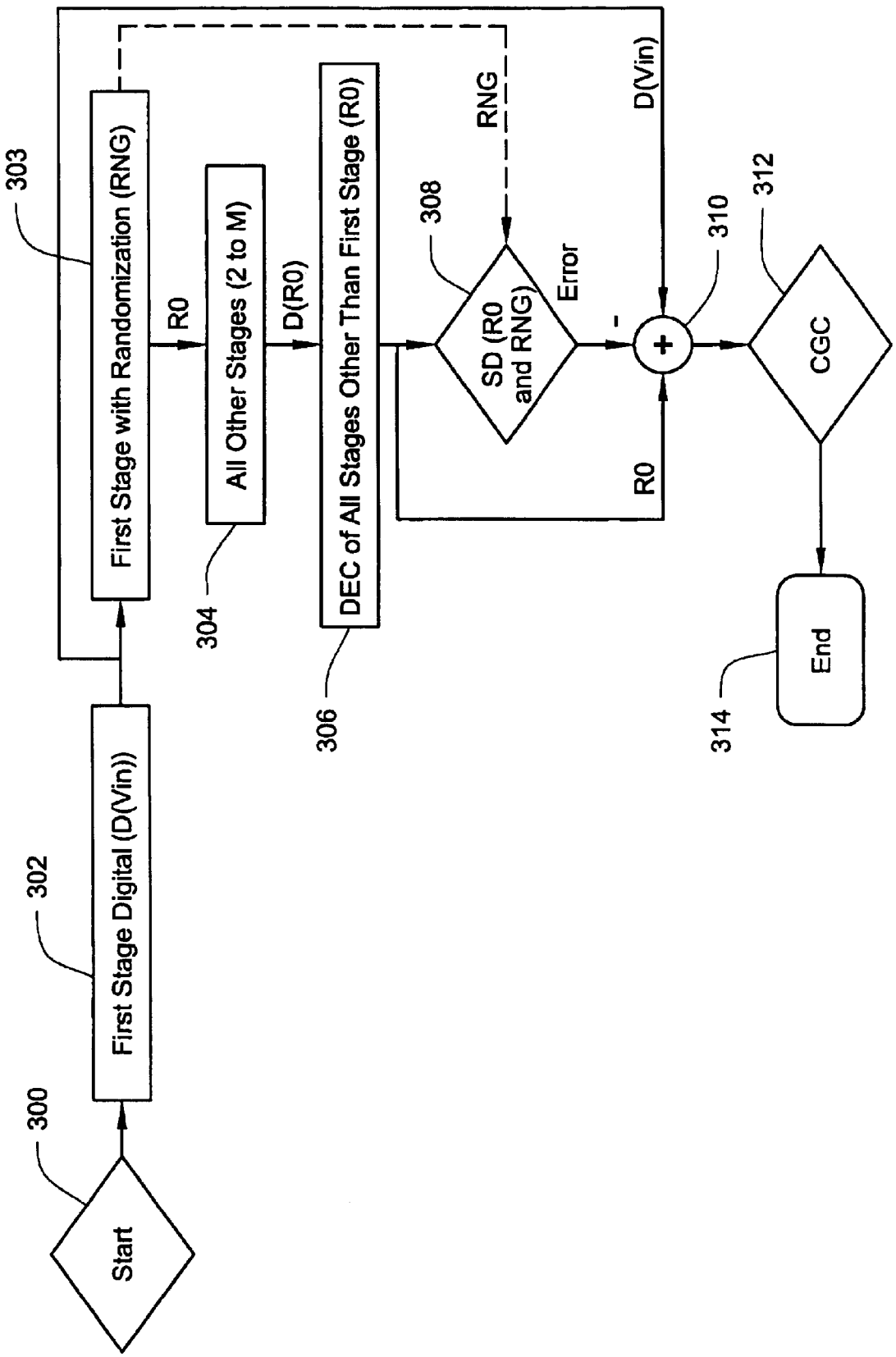
FIG. 8 is a flow diagram for use in describing the operation of the pipelined A/D converter apparatus of FIG. 6 and FIG. 7 according to the present invention.

As shown in FIG. 8, the conversion process is started (block 300) as the input Vin is sampled and applied to first stage 202 as shown in block 302. The first stage 202 provides for an analog-to-digital conversion of the sampled Vin to provide a first stage digital output D(Vin) as shown generally by block 302. The first stage digital output signal D(Vin) is later combined with the other combined and nonlinearity corrected digital outputs R1 from the one or more subsequent stages 204 representative of the first stage digital residue D(R0) for use in providing a corrected digital output signal R2 to block 312 for continuous gain error correction.

The randomized first stage digital output signal D(Vin) is also provided from the ADC 212 to DAC 214 where the first stage digital output signal D(Vin) is reconverted to an analog signal for subtraction (e.g., via summing node 216) from the sampled Vin applied to first stage 202 to obtain the first stage analog residue signal R(0). Such reconversion or digital to analog conversion of D(Vin) is performed using randomizer 210 that provides for randomization of the D(Vin) for use in control of the selection of capacitors for generating the output of the DEM DAC 214. Such randomization involves the generation of pseudorandom sequence RNG that includes the random and parity bits as described above. In other words, the randomizer 210 randomizes the D(Vin) to provide a random D(Vin) for use in generating the residue R0 as shown in block 303. The first stage analog residue R0 is provided with amplification (e.g., amplifier 207) and applied to the second stage of the other subsequent stages 204 as shown by block 304. The residue R0 applied to the second stage of the converter 200 can be expressed as $R0=(1+GE)*(Vin-D(Vin))$.

The pseudorandom sequence (e.g., randomized bit and parity bits) from the first stage randomization (block 303) is provided for use by nonlinearity correction or SD logic of block 308. Further, the first stage analog residual signal R0 is digitized by the one or more subsequent stages 204 as shown generally by block 306. With the first stage residue signal R0 digitized, the first stage digital residue signal D(R0) is also applied to the nonlinearity correction block 308.

Nonlinearity can then be estimated by averaging the pseudorandom sequence RNG from first stage randomization 303 with the first stage digital residue signal D(R0) resulting in SDR which can be expressed as $SDR=Avg(R0*RNG)=(1+GE)*(-non)$.

The averaged first stage digital residue correction signal SDR (i.e., determined by SD logic 230) can be subtracted from a sum of the first stage digital residue signal D(R0) and the first stage digital signal D(Vin) resulting from the analog-to-digital conversion performed by ADC 60 of the first stage 54 as shown by combining node 310. The DEC logic 220 is used to align the bits of the digital outputs from the first stage 202 and the other subsequent stages 204 (also shown generally as block 306). As shown in FIG. 6, the subtraction is carried out by subtracting the averaged first stage digital residue correction signal SDR from the DEC combined digital outputs of the subsequent stages 204 (i.e., the correction is made to D(R0) or, in other words, combined digital outputs of the stages 2-M) resulting in R1 as shown in FIG. 7 which is expressed as $R1=R0-SDR=(1+GE)*(Vin-D(Vin))$.

Thereafter, the D(Vin) of the first stage 202 is added to corrected digital residue signal R1 (see summing node 235 of FIG. 7) resulting in nonlinearity corrected digital output signal R2. R2 is written as $R2=R1+D(Vin)=Vin+GE*(Vin-D)(Vin))$.

The nonlinearity corrected digital output signal R2 is provided for continuous gain error correction (block 312). For example, such gain error correction is preferably provided by the averaging, over a plurality of samples, of the nonlinearity corrected digital output signal R2. Such averaging of the nonlinearity corrected digital output signal R2 to correct for gain error is performed concurrently with the estimation of the nonlinearity error introduced by DAC 214.

As shown in FIG. 7, a gain amplifier 250 is used at the output of the subsequent stages 204. Suitable gain is provided to offset the gain added by the interstage amplifiers of the stages. For example, the gain may be equal to $\frac{1}{2}^{(N1-1)}$ where N1 is the bit resolution of the one or more stages 204. By providing the gain at this position in the signal chain, the digital output D(Vin) of the first stage 202 does not require amplification and can be added directly to the corrected combined output R1 without the DEC logic 220 processing the D(Vin).

Further with reference to the operation shown in FIG. 3, following an initial start-up time during which the pipeline is being filled, the first digital output signal Dout representative of the first sample of Vin is provided at the output of the A/D converter apparatus 200. The Dout can be expressed by:

$Dout=Avg(R2)=Vin$

Each following clock cycle provides additional digitized outputs represented of subsequent samples of Vin that are corrected for both nonlinearity error and gain error. In other words, such nonlinearity and gain error correction techniques are performed concurrently to provide a pipelined output. The conversion is completed (block 314) upon providing an output representative of the last sample of input Vin.

Generally, as previously described herein, the digital functionality of the A/D converter 200 is implemented in the form of a FPGA. The other analog circuitry is implemented using any suitable component technologies.

All references cited herein are incorporated in their entirety as if each were incorporated separately. This invention has been described with reference to illustrative embodiments and is not meant to be construed in a limiting sense. Various modifications of the illustrative embodiments, as well as additional embodiments of the invention, will be apparent to persons skilled in the art upon reference to this description.

What is claimed is:

1. A method of correcting error in a multiple stage analog to digital converter over a plurality of clock cycles, the method comprising:

providing a digital signal from a first stage of the multiple stage analog to digital converter based on an input signal to the first stage of the multiple stage analog to digital converter;

providing an analog signal from the first stage of the multiple stage analog to digital converter based on the first stage digital signal;

subtracting the analog signal provided by the first stage of the multiple stage analog to digital converter from the input signal resulting in a first stage analog residue signal;

amplifying the resultant first stage analog residue signal and applying the amplified first stage analog residue signal to a second stage of one or more subsequent stages of the multiple stage analog to digital converter;

providing a first stage digital residue signal from the one or more subsequent stages based on the amplified first stage analog-residue signal applied thereto;

continuously, over the plurality of clock cycles, averaging the first stage digital residue signal with a pseudorandom sequence resulting in an averaged first stage digital residue correction signal;

subtracting the averaged first stage digital residue correction signal from a sum of the first stage digital residue signal and the first stage digital signal of the multiple stage analog to digital converter for use in providing a non-linearity corrected digital output signal; and continuously, over the plurality of clock cycles, averaging the non-linearity corrected digital output signal to correct for gain error.

2. The method of claim 1, wherein subtracting the averaged first stage digital residue correction signal from a sum of the first stage digital residue signal and the first stage digital signal of the multiple stage analog to digital converter to provide a non-linearity corrected digital output signal comprises:

subtracting the averaged first stage digital residue correction signal from the first stage digital residue signal resulting in a corrected first stage digital residue signal; and summing the corrected first stage digital residue signal with the first stage digital signal resulting in the non-linearity corrected output signal.

3. The method of claim 1, wherein the method further comprises:

providing a second stage digital signal from the second stage of the multiple stage analog to digital converter based on the amplified first stage analog residue signal applied thereto;

providing an analog signal from the second stage of the multiple stage analog to digital converter based on the second stage digital signal;

subtracting the analog signal provided by the second stage of the multiple stage analog to digital converter from the amplified first stage analog residue signal resulting in a second stage analog residue signal;

amplifying the resultant second stage analog residue signal and applying the amplified second stage analog residue signal to another stage of the other one or more subsequent stages of the multiple stage analog to digital converter;

providing a second stage digital residue signal from the one or more subsequent stages based on the amplified second stage analog residue signal applied thereto;

continuously, over the plurality of clock cycles, averaging the second stage digital residue signal with a pseudo-random sequence resulting in an averaged second stage digital residue correction signal; and subtracting the averaged second stage digital residue correction signal from the sum of the first stage digital residue signal and the first stage digital signal of the multiple stage analog to digital converter for use in providing the non-linearity corrected digital output signal.

4. The method of claim 3, wherein the method further comprises providing and subtracting additional averaged digital residue correction signals associated with additional stages of the other one or more subsequent stages to correct for non-linearity.

5. The method of claim 1, wherein summing the first stage digital residue signal with the digital signal from the first stage of the multiple stage analog to digital converter and subtracting the first stage digital residue correction signal therefrom resulting in a non-linearity corrected output signal further comprises correcting alignment of the first stage digital residue signal and the digital signal from the first stage of the multiple stage analog to digital converter.

6. The method of claim 1, wherein averaging the first stage digital residue signal with a pseudorandom sequence resulting in an averaged first stage digital residue correction signal comprises averaging the first stage digital residue signal with a pseudorandom sequence that is based on a pseudorandom sequence used to provide the analog signal from the first stage of the multiple stage analog to digital converter based on the digital signal.

7. The method of claim 1, wherein providing the digital signal from the first stage of the multiple stage analog to digital converter based on the input signal to the first stage comprises providing an N-bit digital signal from the first stage of the multiple stage analog to digital converter based on the input signal thereto, where N is an integer in the range of 3 to 6.

8. The method of claim 1, wherein the multiple stage analog to digital converter forms a part of a communication system.

9. The method of claim 8, wherein the multiple stage analog to digital converter forms a part of a base station of a communication system.

10. The method of claim 1, wherein the plurality of clock cycles is preceded by a plurality of initial startup cycles.

11. A method of correcting non-linearity error and gain error in a multiple stage pipeline analog to digital converter, the method comprising:

using an analog to digital conversion to provide a digital signal from a first stage of the multiple stage pipeline analog to digital converter based on an input signal to the first stage thereof;

using a digital to analog conversion to provide an analog signal from the first stage of the multiple stage pipeline analog to digital converter based on the first stage digital signal provided by the analog to digital conversion, wherein the digital to analog conversion introduces non-linearity error into the multiple stage pipeline analog to digital converter;

subtracting the analog signal provided by the digital to analog conversion from the input signal resulting in a first stage analog residue signal;

amplifying the resultant first stage analog residue signal and applying the amplified first stage analog residue signal to one or more subsequent stages of the multiple stage pipeline analog to digital converter, wherein the amplification introduces gain error into the multiple stage pipeline analog to digital converter;

using at least an analog to digital conversion to provide a first stage digital residue signal from the one or more subsequent stages based on the amplified first stage analog residue signal;

providing a digital output during each clock cycle of a clock time period based on at least the first stage digital signal provided by the analog to digital conversion in the first stage and the first stage digital residue signal, wherein providing the digital output comprises:

correcting, during each clock cycle of a plurality of clock cycles of the clock time period, at least a portion of the non-linearity error with use of an averaging over time of the first stage digital residue signal with a pseudorandom sequence, wherein such correction is used to provide a non-linearity corrected digital signal; and correcting, during the each clock cycle of a plurality of clock cycles of the clock time period, at least a portion of the gain error by averaging the non-linearity corrected digital signal over time.

12. The method of claim 11, wherein correcting at least a portion of the non-linearity error comprises:

averaging the first stage digital residue signal with a pseudorandom sequence resulting in an averaged first stage digital residue correction signal;

subtracting the averaged first stage digital residue correction signal from the first stage digital residue signal resulting in a corrected first stage digital residue signal; and summing the corrected first stage digital residue signal with the first stage digital signal for use in providing the non-linearity corrected digital signal.

13. The method of claim 11, wherein averaging over time of the first stage digital residue signal with a pseudorandom sequence comprises averaging the first stage digital residue signal with a pseudorandom sequence that is based on a pseudorandom sequence used to perform the digital to analog conversion.

14. The method of claim 11, wherein using an analog to digital conversion to provide a digital signal from a first stage of the multiple stage pipeline analog to digital converter comprises providing an N-bit digital signal from the first stage based on the input signal thereto, where N is an integer in the range of 3 to 6.

15. The method of claim 11, wherein the multiple stage analog to digital converter forms a part of a communication system.

16. The method of claim 11, wherein the plurality of clock cycles is preceded by a plurality of initial startup clock cycles.

17. A method of correcting non-linearity error and gain error in a multiple stage pipeline analog to digital converter over a plurality of clock cycles, the method comprising:

correcting, during each of the plurality of clock cycles, at least a portion of non-linearity error introduced by a digital to analog conversion performed in a first stage of the multiple stage pipeline analog to digital converter with use of an averaging over time of a first stage digital residue signal provided by the remainder stages of the multiple stage pipeline analog to digital converter, wherein such correction is used to provide a non-linearity corrected digital signal; and correcting, during each of the plurality of clock cycles, at least a portion of a gain error introduced by one or more amplifiers in the multiple stage pipeline analog to digital converter by averaging the non-linearity corrected digital signal over time.

18. The method of claim 17, wherein averaging over time of the first stage digital residue signal comprises averaging the first stage digital residue signal with a pseudorandom sequence that is based on a pseudorandom sequence used to perform the digital to analog conversion.

19. The method of claim 17, wherein the method further comprises using an analog to digital conversion to provide a digital signal from the first stage of the multiple stage pipeline analog to digital converter, wherein the digital signal is an N-bit digital signal, where N is an integer in the range of 3 to 6.

20. The method of claim 17, wherein the multiple stage pipeline analog to digital converter forms a part of a communication system.

21. A multiple stage pipeline analog to digital converter apparatus, the apparatus comprising:

a plurality of stages comprising a first stage and one or more subsequent stages, wherein at least the first stage is configured to receive an input signal and is connected to a subsequent stage by an amplifier, wherein the first stage comprises:

an analog to digital converter configured to receive the input signal and convert the input signal into a digital signal;

a digital to analog converter configured to receive the digital signal from the analog to digital converter and convert the digital signal to an analog signal; and a subtraction circuit operable to subtract the analog signal received from the digital to analog converter from the input signal applied to the first stage resulting in a first stage analog residue signal that is applied to the amplifier between the first stage and the one or more subsequent stages, wherein the one or more subsequent stages comprise at least one stage operable to convert the first stage analog residue signal to a first stage digital residue signal;

a non-linearity correction circuit associated with the first stage operable to continuously provide, during each of a plurality of clock cycles, an average of the first stage digital residue signal with a pseudorandom sequence resulting in an averaged first stage digital residue correction signal;

a combining circuit configured to subtract the averaged first stage digital residue correction signal from a sum of the first stage digital signal from the analog to digital converter and at least the first stage digital residue signal for use in providing a non-linearity corrected digital output signal; and a gain correction circuit operable to continuously provide, during each of the plurality of clock cycles, an average of the non-linearity corrected digital output signal.

22. The apparatus of claim 21, wherein the logic circuit is configured to subtract the averaged first stage digital residue correction signal from the first stage digital residue signal resulting in a corrected first stage digital residue signal and, thereafter, sum the corrected first stage digital residue signal with the first stage digital signal for use in providing the non-linearity corrected digital output signal.

23. The apparatus of claim 21, wherein at least one additional stage of the one or more subsequent stages comprises:

a flash analog to digital converter configured to receive an input signal from a previous stage and convert the input signal into a digital signal;

a digital to analog converter configured to receive the digital signal from the flash analog to digital converter of the at least one additional stage and convert the digital signal to an analog signal;

a subtraction circuit operable to subtract the analog signal received from the digital to analog converter from the input signal applied to the additional stage resulting in an additional stage analog residue signal that is applied to an amplifier between the additional stage and further subsequent stages of the one or more subsequent stages, wherein the further subsequent stages comprise at least one stage operable to convert the additional stage analog residue signal to an additional stage digital residue signal; and an additional non-linearity correction circuit associated with the additional stage operable to average the additional stage digital residue signal with a pseudorandom sequence resulting in an additional stage averaged correction signal, wherein the combining circuit is further configured to subtract the additional stage averaged correction signal from the sum of the first stage digital signal and at least the first stage digital residue signal for use in providing the non-linearity corrected digital output signal.

24. The apparatus of claim 21, wherein the combining circuit comprises digital correction circuitry configured to align at least the first stage digital residue signal provided by the one or more subsequent stages of the multiple stage pipeline analog to digital converter apparatus.

25. The apparatus of claim 21, wherein the digital to analog converter of the first stage has an associated pseudorandom sequence associated therewith, and further wherein the pseudorandom sequence used by the non-linearity correction circuit is a pseudorandom sequence based on the pseudorandom sequence associated with the digital to analog converter.

26. The apparatus of claim 21, wherein the analog to digital converter of the first stage comprises an N-bit analog to digital converter, where N is an integer in the range of 3 to 6.

27. The apparatus of claim 21, wherein the multi-stage pipeline analog to digital converter forms a part of a communication apparatus.

28. The apparatus of claim 27, wherein the multi-stage pipeline analog to digital converter forms a part of a base station of the communication apparatus.

29. The apparatus of claim 21, wherein the multiple stage pipeline analog to digital converter apparatus is implemented using at least one application specific integrated circuit.

30. The apparatus of claim 21, wherein the multiple stage pipeline analog to digital converter apparatus is implemented using at least one field programmable logic array.

31. An apparatus for use correcting non-linearity error and gain error in a multiple stage pipeline analog to digital converter over a plurality of clock cycles, the apparatus comprising:

means for correcting, during each of the plurality of clock cycles, at least portion of non-linearity error introduced by a digital to analog conversion performed in a first stage of the multiple stage pipeline analog to digital converter with use of an averaging over time of a first stage digital residue signal provided by the remainder stages of the multiple stage pipeline analog to digital converter, wherein such correction is used to provide a non-linearity corrected digital signal; and means for correcting, during each of the plurality of clock cycles, at least a portion of a gain error introduced by one or more amplifiers in the multiple stage pipeline analog to digital converter by averaging the non-linearity corrected digital signal over time.

32. The apparatus of claim 31, wherein the apparatus forms a part of a communication system.

33. The apparatus of claim 31, wherein the multiple stage pipeline analog to digital converter apparatus is implemented using at least one of an application specific integrated circuit and a field programmable logic array.

* * * * *